(12) United States Patent
Isaacson et al.

(10) Patent No.: US 10,926,523 B2
(45) Date of Patent: Feb. 23, 2021

(54) PERFORMANCE ENHANCEMENT OF SENSORS THROUGH SURFACE PROCESSING

(71) Applicant: Sensel, Inc., Mountain View, CA (US)

(72) Inventors: Scott Gregory Isaacson, Mountain View, CA (US); Ilya Daniel Rosenberg, Mountain View, CA (US); Stephanie Jeanne Oberg, Sunnyvale, CA (US); Brogan Carl Miller, Davis, CA (US)

(73) Assignee: Sensel, Inc., Mountain View, CA (US)

( * ) Notice: Subject to any disclaimer, the term of this patent is extended or adjusted under 35 U.S.C. 154(b) by 217 days.

(21) Appl. No.: 16/012,500

(22) Filed: Jun. 19, 2018

(65) Prior Publication Data
US 2019/0381779 A1    Dec. 19, 2019

(51) Int. Cl.
*B32B 38/00*  (2006.01)
*B32B 38/10*  (2006.01)
*B32B 38/18*  (2006.01)

(52) U.S. Cl.
CPC ..........  *B32B 38/0012* (2013.01); *B32B 38/10* (2013.01); *B32B 38/1858* (2013.01);
(Continued)

(58) Field of Classification Search
CPC . B32B 38/0012; B32B 38/10; B32B 38/1858; B32B 2038/0016; B32B 2038/0064
See application file for complete search history.

(56) References Cited

U.S. PATENT DOCUMENTS

| 4,202,092 A | 5/1980 | Shibasaki et al. |
| 4,238,265 A * | 12/1980 | Deminet ............... G02B 5/10 |
| | | 156/221 |

(Continued)

FOREIGN PATENT DOCUMENTS

JP   09289194 A  * 11/1997

OTHER PUBLICATIONS

International Search Report and Written Opinion received for PCT Application Serial No. PCT/US2019/036691 dated Oct. 22, 2019, 14 pages.

(Continued)

*Primary Examiner* — David A. Rogers
(74) *Attorney, Agent, or Firm* — Amin, Turocy & Watson, LLP

(57) ABSTRACT

Techniques for modifying surfaces of electrodes are provided. An electrode surface can be processed by applying an abrasive material or chemical solution to or against the surface to modify the surface to reduce the amount of roughness on, and/or alter the shape of, the surface. The shape of the surface can be altered by rounding or doming the surface. During surface processing, flexible or compressible support material can be applied to the back of an abrasive material, such as sandpaper, to desirably distribute pressure from the support material to the sandpaper and/or mold the shape of the sandpaper to facilitate maintaining desirable contact by the sandpaper on electrode surfaces. With regard to a flexible circuit board on which electrodes are formed, a vacuum chuck component or a temporary abrasive can be used to hold the circuit board in a flat and stationary position during surface processing.

25 Claims, 21 Drawing Sheets

(52) U.S. Cl.
CPC .......... *B32B 2038/0016* (2013.01); *B32B 2038/0064* (2013.01)

(56) References Cited

U.S. PATENT DOCUMENTS

| | | | |
|---|---|---|---|
| 4,969,966 A * | 11/1990 | Norman | B32B 17/10036 156/102 |
| 5,148,595 A | 9/1992 | Dogget et al. | |
| 5,489,750 A | 2/1996 | Sakemi et al. | |
| 5,849,624 A | 12/1998 | Fazan et al. | |
| 6,699,376 B2 * | 3/2004 | Naito | G01N 27/407 204/425 |
| 6,939,207 B2 * | 9/2005 | Jensen | B24B 21/04 451/41 |
| 7,005,381 B1 * | 2/2006 | Cox | H01J 9/02 438/689 |
| 7,066,786 B2 * | 6/2006 | Fujishima | B24B 49/12 451/5 |
| 7,095,157 B2 * | 8/2006 | Sung | C23C 16/01 310/313 B |
| 7,141,146 B2 * | 11/2006 | Bogart | B23H 5/08 204/199 |
| 7,347,084 B2 | 3/2008 | Tölzer et al. | |
| 7,470,171 B2 * | 12/2008 | Zhang | B24B 37/005 438/690 |
| 7,731,835 B2 * | 6/2010 | Buck | A61B 5/14532 204/403.04 |
| 7,930,815 B2 | 4/2011 | Coleman et al. | |
| 7,960,284 B2 * | 6/2011 | Hachigo | C30B 29/40 257/E21.222 |
| 8,052,860 B1 * | 11/2011 | Engelhaupt | B23H 5/10 205/641 |
| 8,097,148 B2 | 1/2012 | Dietze | |
| 8,603,574 B2 * | 12/2013 | Huang | H05K 3/0014 427/162 |
| 9,368,393 B2 * | 6/2016 | Gabriel | H01L 21/31116 |
| 9,393,670 B2 * | 7/2016 | Matsuo | B24B 37/005 |
| 9,551,085 B2 | 1/2017 | Liao | |
| 9,638,662 B2 | 5/2017 | Pollack et al. | |
| 10,043,799 B2 * | 8/2018 | Park | H01L 21/32053 |
| 10,065,406 B2 * | 9/2018 | Garner | B29C 53/005 |
| 10,289,230 B2 * | 5/2019 | Park | B32B 18/00 |
| 10,303,316 B2 * | 5/2019 | Omote | G06F 3/044 |
| 10,386,251 B2 * | 8/2019 | Klemm | G01L 1/26 |
| 10,509,524 B2 * | 12/2019 | Nukui | G06F 3/041 |
| 10,548,224 B2 * | 1/2020 | Kim | H05K 1/189 |
| 10,572,081 B2 * | 2/2020 | Vandermeijden | G06F 3/0416 |
| 2004/0192053 A1 * | 9/2004 | Fujimoto | H01L 21/31116 438/697 |
| 2005/0051427 A1 * | 3/2005 | Brauker | A61B 5/076 204/412 |
| 2007/0131563 A1 * | 6/2007 | Bogart | H01L 21/7684 205/672 |
| 2010/0103138 A1 * | 4/2010 | Huang | H05K 3/0067 345/174 |
| 2012/0280368 A1 * | 11/2012 | Garner | B32B 17/10036 257/629 |
| 2013/0142994 A1 * | 6/2013 | Wang | C03C 17/256 428/141 |
| 2014/0235141 A1 * | 8/2014 | Maloney | B24B 37/04 451/5 |
| 2015/0030816 A1 * | 1/2015 | Uemura | C03C 21/002 428/192 |
| 2015/0060267 A1 * | 3/2015 | Mollart | C23C 16/56 204/294 |
| 2015/0189758 A1 * | 7/2015 | Kim | H05K 1/189 428/141 |
| 2015/0378464 A1 * | 12/2015 | Kao | G06F 3/044 345/175 |
| 2016/0271756 A1 * | 9/2016 | Petersen | B24B 37/245 |
| 2017/0090639 A1 * | 3/2017 | Park | G06F 3/0414 |
| 2017/0177118 A1 * | 6/2017 | Nukui | G06F 3/041 |
| 2018/0018041 A1 * | 1/2018 | Omote | G06F 3/0416 |
| 2018/0269379 A1 * | 9/2018 | Nie | H01L 41/0471 |
| 2018/0321181 A1 * | 11/2018 | Holmstrom | A61B 5/7225 |
| 2018/0325430 A1 * | 11/2018 | Vaddiraju | A61B 5/14532 |
| 2019/0000337 A1 * | 1/2019 | Derry | A61B 5/04087 |
| 2019/0011316 A1 * | 1/2019 | Klemm | G01L 1/18 |

OTHER PUBLICATIONS

Wood Magazine Staff. "Keys to Successful Hand-Sanding." Wood Magazine, Wood Magazine, Jun. 8, 2016, 8 pages.

Gong et al., "Direct-Referencing Two-Dimensional-Array Digital Microfluidics Using Multilayer Printed Circuit Board", Journal of Microelectromechanical Systems, vol. 17, No. 2, 2008, pp. 257-264.

* cited by examiner

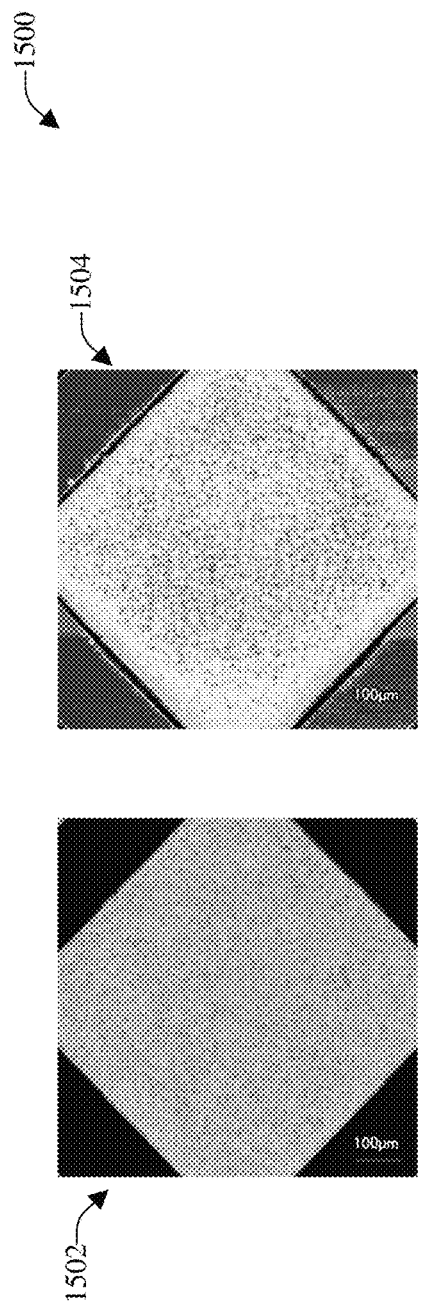
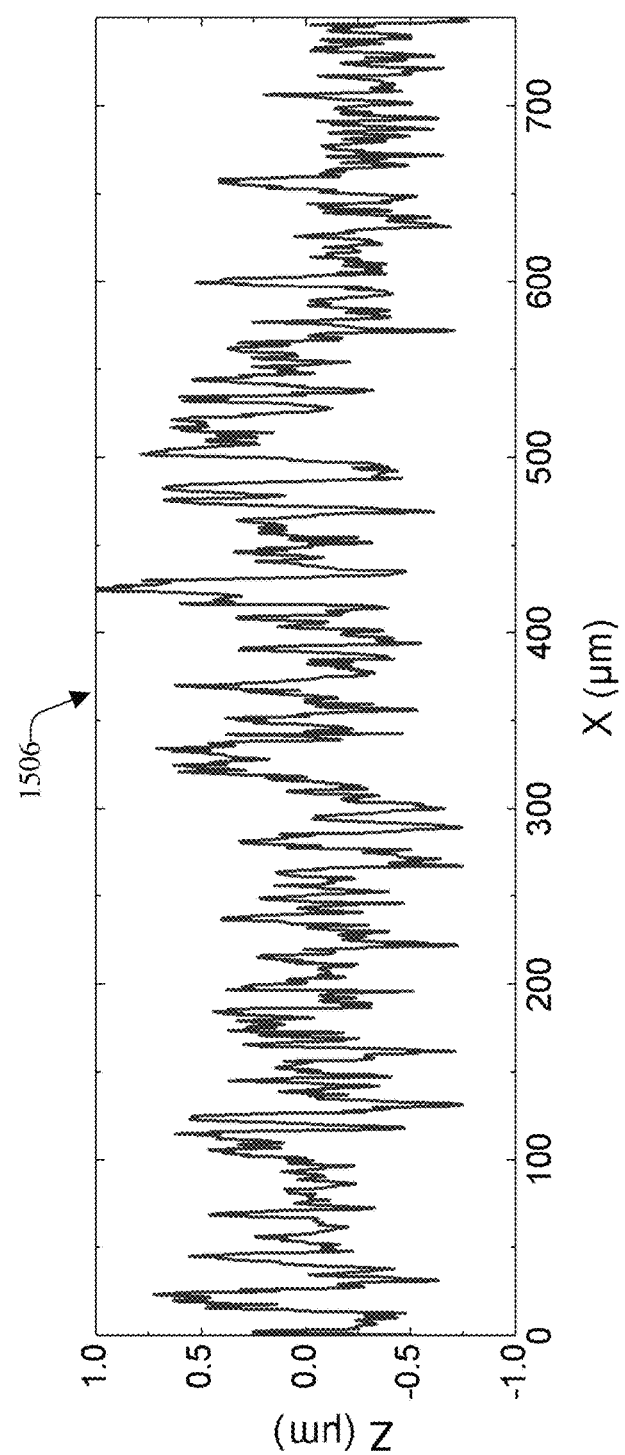
FIG. 15

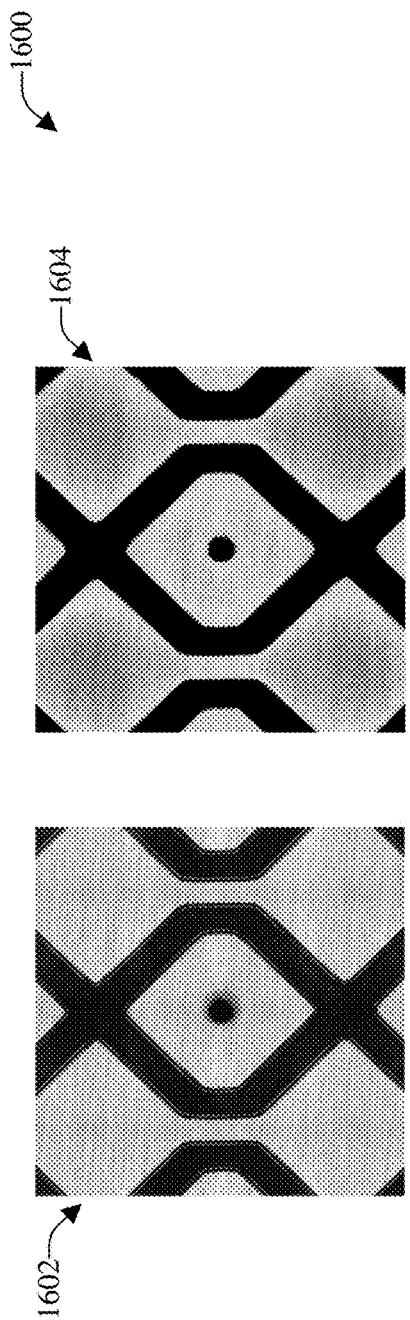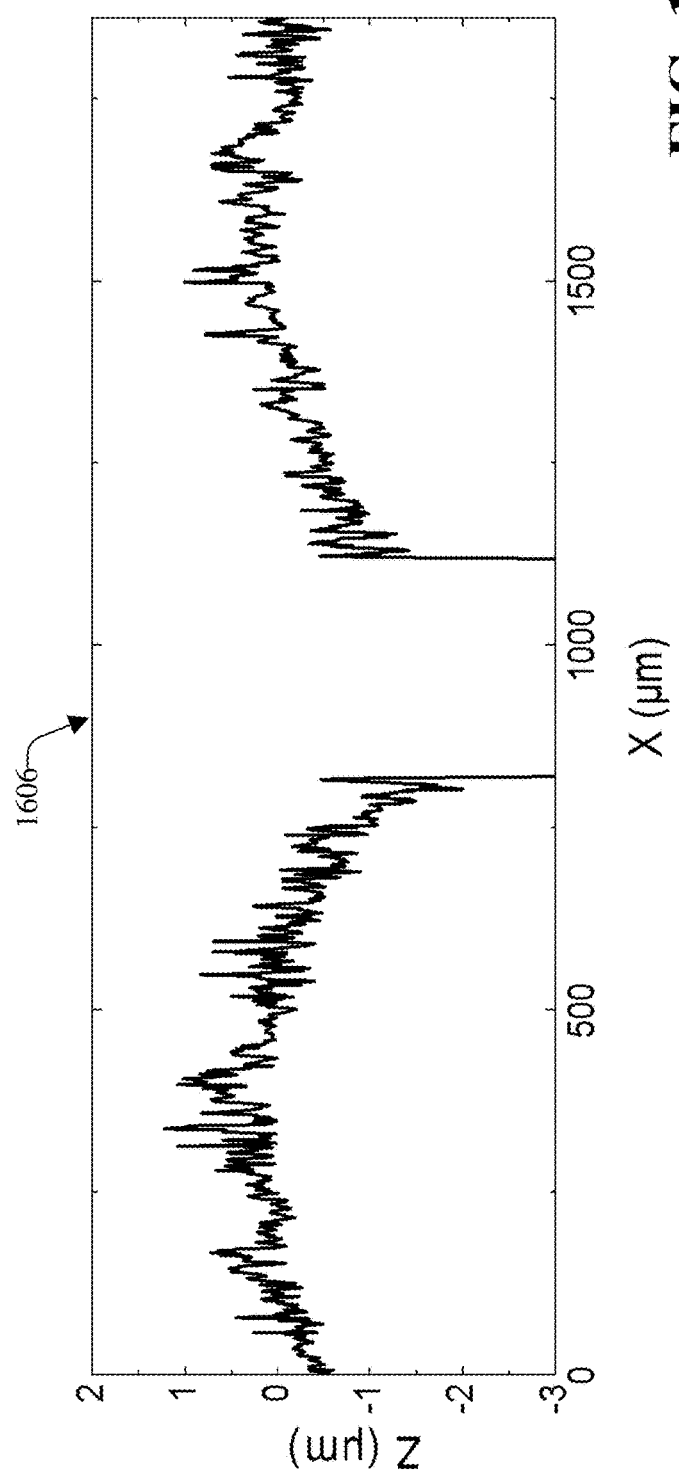
FIG. 16

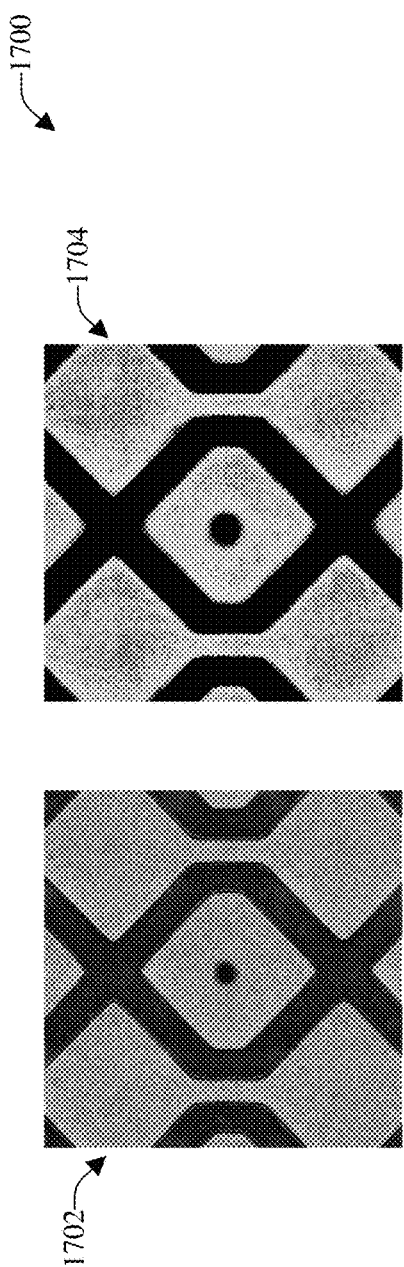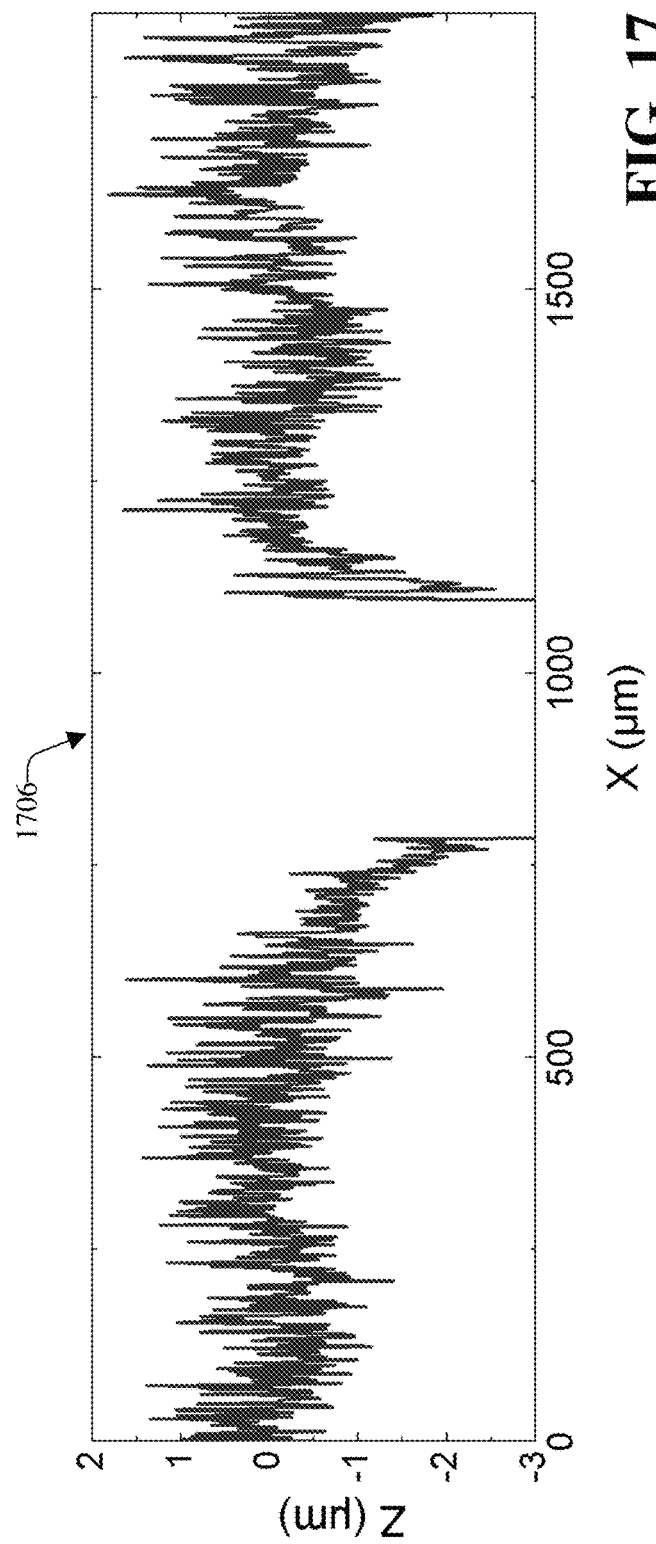
FIG. 17

PERFORMANCE ENHANCEMENT OF SENSORS THROUGH SURFACE PROCESSING

TECHNICAL FIELD

The subject disclosure relates generally to sensors, e.g., to sensitivity enhancement of sensors through surface processing.

BACKGROUND

Various types of sensors can be employed to sense various types of conditions. For example, a force sensing sensor can be utilized to sense, detect, or measure forces on the force sensing sensor or an associated component (e.g., a display screen, such as a touch display screen, and/or a trackpad) of or associated with a device (e.g., mobile phone, computer (e.g., laptop computer), electronic pad or tablet).

Sensors can be manufactured in a variety of ways. For instance, sensors can be manufactured for or on printed circuit boards, or can be manufactured as, or as part of, independent devices (e.g., a sensing membrane of a force sensing module of a sensor device).

The above-described description is merely intended to provide a contextual overview relating to sensors and is not intended to be exhaustive.

SUMMARY

The following presents a simplified summary in order to provide a basic understanding of some aspects described herein. This summary is not an extensive overview nor is intended to identify key/critical elements or to delineate the scope of the various aspects described herein. Its sole purpose is to present some concepts in a simplified form as a prelude to the more detailed description that is presented later.

The disclosed subject matter can comprise a method that can comprise forming an electrode. The method also can comprise modifying a surface of the electrode to at least one of reduce an amount of roughness of the surface of the electrode or alter a shape of the surface, wherein the amount of roughness is based at least in part on a number or a size of protrusions on the surface of the electrode.

The disclosed subject matter also can comprise a device that can include a sensor component. The sensor component can comprise an electrode component formed of a conductive material and comprising a surface. The sensor component also can comprise a conductor component configured to interface with the surface of the electrode component to facilitate sensing of a condition by the sensor component, wherein the surface of the electrode component is modified to at least one of reduce an amount of roughness of the surface of the electrode component or change a shape of the surface, wherein the amount of roughness is based at least in part on a number or a size of protrusions on the surface of the electrode component, and wherein the modification of the surface of the electrode component enhances the interfacing between the surface of the electrode component and the conductor component.

The disclosed subject matter further can comprise a system that can comprise a surface processor component configured to modify a surface of an electrode to at least one of reduce an amount of roughness of the surface of the electrode or change a shape of the surface, wherein the amount of roughness is based at least in part on a number or a size of protrusions on the surface of the electrode. The system also can include an operation management component configured to control the modification of the surface of the electrode, in accordance with a defined surface processing criterion.

To the accomplishment of the foregoing and related ends, certain illustrative aspects are described herein in connection with the following description and the annexed drawings. These aspects are indicative of various ways which can be practiced, all of which are intended to be covered herein. Other advantages and novel features may become apparent from the following detailed description when considered in conjunction with the drawings.

BRIEF DESCRIPTION OF THE DRAWINGS

Various non-limiting embodiments are further described with reference to the accompanying drawings in which:

FIGS. 14 and 15 present respective diagrams of respective electrode-surface information that can illustrate enhancement of a processed (e.g., sanded and rounded) electrode surface that has been modified to be rounded, using the disclosed techniques, as compared to an unprocessed electrode surface, in accordance with various aspects and embodiments of the disclosed subject matter;

FIGS. 16 and 17 depict respective diagrams of respective electrode-surface information that can illustrate enhancement of processed (e.g., sanded and rounded) electrode surfaces, using the disclosed techniques, as compared to an unprocessed electrode surface, in accordance with various aspects and embodiments of the disclosed subject matter;

DETAILED DESCRIPTION

Figure 1:
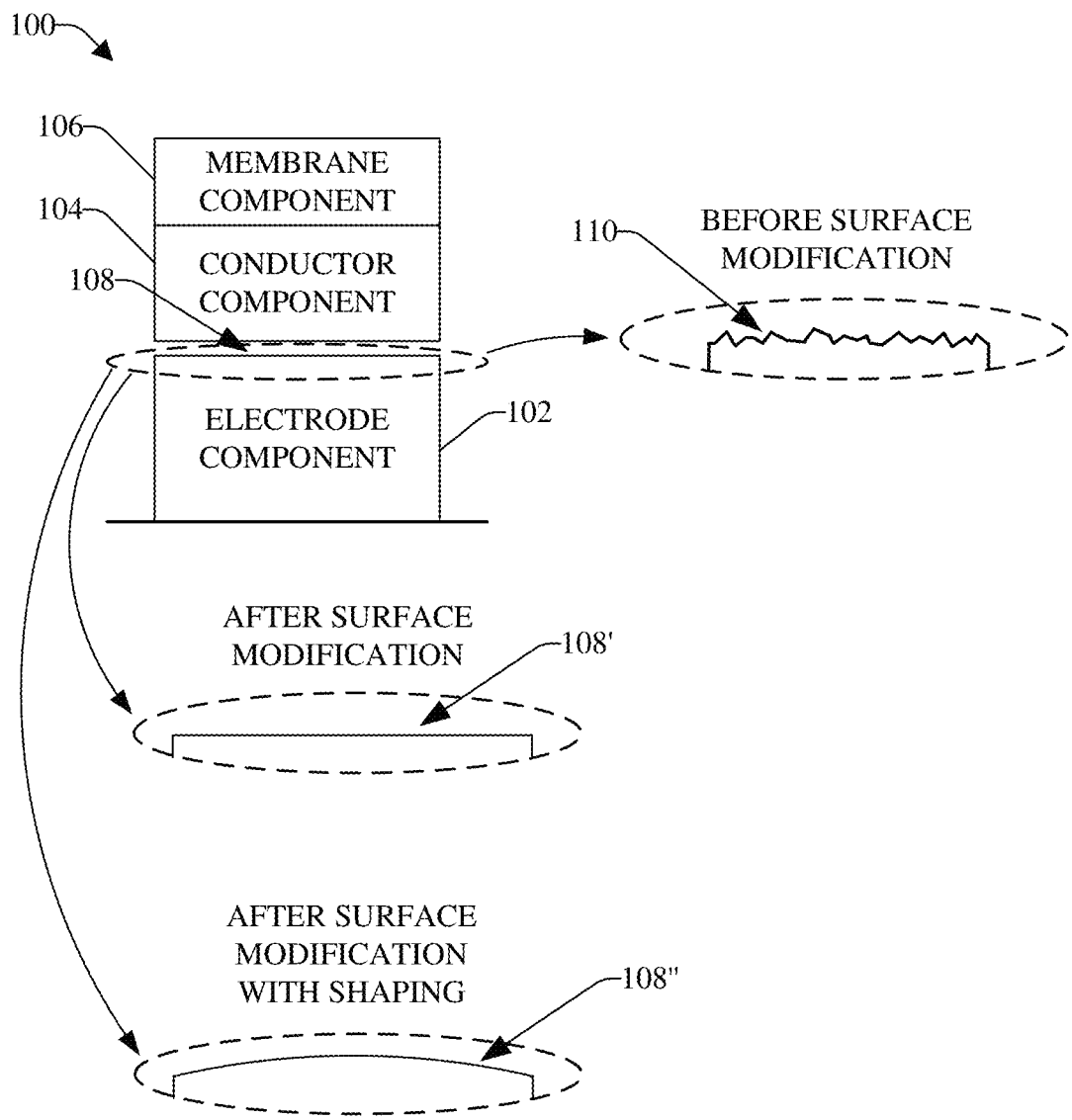
FIG. 1 illustrates a block diagram of an example, non-limiting sensor component that can sense or detect conditions (e.g., in an environment associated with the sensor component), in accordance with various aspects and embodiments of the disclosed subject matter.

One or more embodiments are now described more fully hereinafter with reference to the accompanying drawings in which example embodiments are shown. In the following description, for purposes of explanation, numerous specific details are set forth in order to provide a thorough understanding of the various embodiments. However, the various embodiments can be practiced without these specific details.

Various types of sensors can be employed to sense various types of conditions. For example, a force sensing sensor can be utilized to sense, detect, or measure forces on the force sensing sensor or an associated component (e.g., a display screen, such as a touch display screen, and/or a trackpad) of or associated with a device (e.g., mobile phone, computer (e.g., laptop computer), electronic pad or tablet). Sensors can be manufactured in a variety of ways. For instance, sensors can be manufactured on printed circuit boards (PCBs), or can be manufactured as, or as part of, independent devices (e.g., a sensing membrane of a force sensing module of a sensor device).

Some manufacturing techniques for creating PCBs (e.g., a PCB comprising a sensor) and/or sensing membranes (e.g., force sensing membranes) can produce surfaces on the PCBs and/or sensing membranes that can have undesirable anomalies, rough areas, and/or foreign material that can interfere with contact with the sensor and result in undesirably lower sensitivity of the sensor, inaccurate or undesirable sensing by the sensor, and/or undesirable non-predictable results of the sensor when a PCB and/or sensing membrane (e.g., force sensing membrane) is employed in a device.

To that end, techniques for enhancing the operation and sensitivity of sensors, and enhanced sensor devices, are disclosed herein. The disclosed subject matter can comprise a sensor component that can be or comprise a sensor. The sensor can comprise an electrode component, a conductor component (e.g., a conductive layer) that can be associated with (e.g., situated over and in proximity to, or on) a top surface pad of the electrode component, and a membrane component (e.g., a flexible membrane) that can be associated with (e.g., attached to) the conductor component (e.g., on the side of the conductor component opposite the side of the conductor component associated with the electrode component).

The sensor component can be an independent sensor device or can be part of a PCB that can comprise one or more sensor components. For instance, a PCB can comprise a set of electrodes that can be formed on the PCB in a desired electrode pattern. Respective conductor components can be formed over and in proximity to, or on, the respective electrodes of the set of electrodes, and respective membrane components can be formed over or on, and/or attached to, the respective conductor components.

The sensor component can be any of a variety of different types of sensors. As some examples, the sensor component can be or comprise a force sensor that can sense or measure force on the sensor or an associated surface, a touch sensor that can sense or detect touching of the sensor or a surface (e.g., touch screen surface, trackpad surface) associated with the sensor, or a pressure sensor that can sense or measure pressure on the sensor or an associated surface. The sensor component can be or comprise, for example, a capacitive touch sensor or a piezoresistive touch sensor, and/or can be an interpolating or non-interpolating touch sensor.

To facilitate enhancing the performance of the sensor component, a surface (e.g., a top surface pad) of the electrode component of the sensor component can be processed to desirably modify the surface of the surface to smooth or polish the surface texture of the surface, remove any unwanted nodules, lips, and/or spikes, etc., that protrude from the surface, remove unwanted foreign material from the surface, correct or mitigate undesirable abnormalities on the surface, and/or reduce the roughness of the surface of the electrode component of the sensor component, in accordance with defined surface processing criteria. Additionally or alternatively, the surface of the electrode component also can be processed to desirably modify the surface of the electrode component to shape the surface to have a desired shape, in accordance with the defined surface processing criteria. For example, the surface of the electrode component can be processed to desirably modify the surface of the electrode component to change the surface from a rectangular or flat surface to a domed, rounded, or curved-shaped surface. One or more of these modifications (e.g., smooth, polish, or reduce roughness of the surface, modify shape of the surface, . . . ) of the surface of the electrode component can enhance (e.g., improve) the operation of the sensor component, including enhancing the sensitivity, accuracy, and reliability of the sensor component, as compared to typical manufactured sensors that have not undergone the surface processing described herein.

In certain embodiments, the processing of the surface of the electrode component of the sensor component can be performed using abrasive materials on the surface of the electrode component, wherein the abrasive materials can comprise, for example, sandpaper, diamond or other type of abrasive paste, or a polishing cloth having a desired amount of abrasiveness. With regard to a PCB that comprises a set of electrode components, a PCB often can have certain imperfections, such as bowing of the PCB surface and/or ripples or ridges on the surface of the PCB. As desired, to facilitate having an abrasive material (e.g., sandpaper) maintain desirable contact with the surfaces of the electrode components during processing of the electrode surfaces, a flexible and/or compressible support material can be applied to a back side (e.g., non-abrasive side) of the abrasive material (e.g., sandpaper), and a force can be applied to the flexible and/or compressible support material and desirably distributed to the abrasive material, to facilitate enabling the abrasive material to be molded or shaped (e.g., contoured) to account for the imperfections in the PCB and desirably maintain contact with the electrode surfaces during processing of the electrode surfaces, as more fully described herein.

In other embodiments, the processing of the surface of the electrode component can be performed using chemical polishing and/or etching (e.g., copper or aluminum etching). A desired chemical solution (e.g., a desired acid type chemical) can be applied to the electrode surface to facilitate etching or polishing the electrode surface to reduce the amount of roughness of the electrode surface and/or shape (e.g., round) the electrode surface.

In some embodiments, a surface processor component can be employed to process the surface of the electrode component of the sensor component to desirably modify (e.g., smooth, polish, or reduce roughness of the surface, modify shape of the surface, . . . ) the surface of the electrode component, as described herein. The surface processor component can utilize the abrasive materials and/or the chemical materials, and respectively associated processes (e.g., sanding, abrasive, or abrasive polishing processes, chemical polishing or etching processes), to process the surface of the electrode component to modify the surface, as desired, in accordance with the defined surface processing criteria.

There can be some PCBs, comprising a set of sensor components, wherein the PCB can be flexible. Consequently, it can be possible for the flexible PCB to move or deflect during processing of the surfaces of the electrode components of the sensor components on the PCB. The surface processor component can desirably and/or temporarily immobilize the PCB during the surface modification process to enable the surfaces of the electrode components of the sensor components to be desirably modified. For example, the surface processor component can employ a vacuum chuck component that can utilize a vacuum to hold the PCB in a desirably (e.g., suitably) flat and stationary position (e.g., a rigid or relatively rigid position) during the performance of the surface modification process on the surfaces of the electrode components by the surface processor component. As another example, the surface processor component can employ an adhesive (e.g., a temporary or removable adhesive) to temporarily adhere the PCB to a rigid and flat surface to hold the PCB in a desirably flat and stationary position during the performance of the surface modification process on the surfaces of the electrode components by the surface processor component.

In some embodiments, after the modification (e.g., smooth, polish, or reduce roughness of the surface, modify shape of the surface, . . . ) of the surface of the electrode component of the sensor component, the surface processor component can utilize a desired cleaner (e.g., cleaning material) or vacuum to clean the surface of the electrode component. For example, the surface processor component can employ a vacuum component to vacuum any remaining debris from the surface to clean the surface of the electrode component (e.g., to remove any remaining debris resulting from the surface modification or otherwise on the surface).

The disclosed subject matter (e.g., employing the surface processor component) can provide relatively low-cost techniques for addressing, correcting, and/or mitigating undesirable anomalies, rough areas, and/or foreign material on the surfaces of electrode components of sensor components formed on PCBs, and/or structuring the surface of an electrode component of a sensor component to enable the electrode component to have desirable (e.g., special) characteristics, such as, for example, desired doming, striations, improved flatness, and/or other desired characteristics that can enhance performance of the sensor component. This can result in increased sensitivity, accuracy, and reliability of the sensor components, can reduce unit-to-unit variability of sensor components (e.g., can provide better uniformity and repeatability of sensors), and can reduce the cost of manufacturing of sensor components and PCBs.

Also, the surface modification techniques and processes of the disclosed subject matter, as described herein, can be applicable to and utilized on any, or at least virtually any, type of electrode pattern of electrodes on a PCB, including the electrode patterns described more fully herein.

These and other aspects and embodiments of the disclosed subject matter will now be described with respect to the drawings.

FIG. 1 illustrates a block diagram of an example, non-limiting sensor component 100 that can sense or detect conditions (e.g., in an environment associated with the sensor component), in accordance with various aspects and embodiments of the disclosed subject matter. The sensor component 100 can comprise an electrode component 102 that can be a conductive component formed of a conductive material (e.g., copper, copper-based material). The electrode component 102 can be formed or placed on a base component (e.g., substrate component) (not shown in FIG. 1).

The sensor component 100 also can include a conductor component 104 (e.g., a conductive layer) that can be situated over and in proximity to, or on, the top surface (e.g., top surface pad) of the electrode component 102. The conductor component 104 can be formed of a conductive material. In some embodiments, the conductive material of the conductor component 104 can be a conductive ink, such as, for example, a carbon ink, a force sensing resistor (FSR) ink, or piezoresistive ink. In other embodiments, the conductive material of the conductor component 104 can be a conductive metal material.

The sensor component 100 further can comprise a membrane component 106 that can be formed or placed over and/or adhered to a top surface of the conductor component 104. The membrane component 106 can be formed of a flexible material that can allow the membrane component 106 to move or deflect in response to a force being applied to the membrane component 106, wherein movement or deflection in response to forces can be predictable, substantially consistent, and/or reproducible (e.g., a particular amount of force applied on the membrane component 106 can result in a particular amount of deflection each time the particular amount of force is applied). The flexible material can be or comprise a polymer or plastic material, for example. In some embodiments, the conductor component 104 and the membrane component 106 can be formed as a single and/or integrated component.

Generally, with regard to a force-sensing resistive type of sensor, in response to a force applied to the membrane component 106, the movement or deflection of the membrane component 106, which can result from the application of force to the membrane component 106, can be detected by or impacted on the conductor component 104 and can alter the interaction or interfacing between the conductor component 104 and electrode component 102 to increase the amount of conductance and reduce the amount of resistance between the conductor component 104 and electrode component 102. Generally, the greater the amount of force applied to the membrane component 106, the greater the increase in the amount of conductance and the greater the reduction in the amount of resistance between the conductor component 104 and electrode component 102. The amount of change in the conductance and/or the amount of change in the resistance can be detected or measured, and can correspond to (e.g., can be a function of) the amount of force being applied to the membrane component 106. Thus, the amount of force being applied to the membrane component 106 can be determined based at least in part on (e.g., as a function of) the amount of change in the conductance and/or the amount of change in the resistance between the conductor component 104 and electrode component 102.

The electrode component 102, conductor component 104, and membrane component 106 (and other components not shown in FIG. 1) can form a sensor 100. The sensor component 100 can be an independent sensor device or can be part of a PCB that can comprise one or more sensor components. For instance, a PCB can comprise a set of electrode components (e.g., electrodes) that can be formed on the PCB in a desired electrode pattern. Respective conductor components can be formed over and in proximity to, or on, the respective electrode components of the set of electrode components, and respective membrane components can be formed over or on, and/or attached to, the respective conductor components.

The sensor component 100 can be any of a variety of different types of sensors. As some examples, the sensor component 100 can be or comprise a force sensor that can sense or measure force on the sensor or an associated surface, a touch sensor that can sense or detect touching of the sensor or a surface (e.g., touch screen surface, trackpad surface) associated with the sensor, or a pressure sensor that can sense or measure pressure on the sensor or an associated surface. The sensor component 100 can be or comprise, for example, a capacitive touch sensor or a piezoresistive touch sensor, and/or can be an interpolating or non-interpolating touch sensor.

During manufacture of the sensor component 100, when the electrode component 102 (e.g., electrode) is initially formed, the surface 110 (e.g., top surface) of the electrode can be relatively rough and/or can have undesirable anomalies that can negatively affect the performance of the sensor component 100. For example, the unprocessed top surface 110 of the electrode component 102 can have nodules, lips, and/or spikes, etc., that can protrude from the surface 110, can have unwanted foreign material thereon, can have other undesirable abnormalities, and/or can otherwise be a relatively rough surface (e.g., can have a relatively rough texture). Such an unprocessed surface 110, with the surface being relatively rough and/or having undesirable anomalies, can negatively impact the performance of the sensor, for example, by negatively impacting (e.g., reducing) the sensitivity of the sensor, negatively impacting (e.g., reducing) the accuracy of sensing or measuring by the sensor, and/or negatively impacting (e.g., reducing) the reliability of the sensor.

To facilitate enhancing the performance of the sensor component 100, as part of the manufacture process to create the sensor component 100, the surface 110 (e.g., the unprocessed top surface pad before surface modification) of the electrode component 102 of the sensor component 100 can be processed to desirably modify the surface 110 to create a processed surface 108 to smooth or polish the surface texture of the surface 110, remove any unwanted nodules, lips, and/or spikes, etc., that protrude from the surface 110, remove unwanted foreign material from the surface 110, correct or mitigate undesirable abnormalities on the surface 110, and/or reduce the roughness of the surface 110 of the electrode component 102 to create the processed surface 108 (e.g., as depicted by the processed surface 108' in the exploded view), in accordance with the defined surface processing criteria. Additionally or alternatively, the surface 110 (e.g., an unprocessed top surface pad) of the electrode component 102 can be processed to desirably modify the surface 110 to shape the surface 110 to create a processed surface 108 that can have a desired shape (e.g., as illustrated by the processed surface 108" in the exploded view), in accordance with the defined surface processing criteria. For example, the surface 110 can be processed to desirably modify the surface 110 to change the surface 110 from a rectangular or flat surface to a domed, rounded, or curved-shaped surface (e.g., processed surface 108"), in accordance with the defined surface processing criteria. One or more of these modifications (e.g., smooth, polish, or reduce roughness of the surface, modify shape of the surface, . . . ) of the surface 110 of the electrode component 102 to create the processed surface 108 can enhance (e.g., improve) the operation of the sensor component 100, including enhancing the sensitivity, accuracy, and reliability of the sensor component 100, as compared to typical manufactured sensors that have not undergone the electrode surface processing and modification described herein. For example, the disclosed modifying of the surface 110 to create the processed surface 108 of the electrode component 102 can enhance operation of the force sensing module (e.g., the electrode component 102, conductor component 104, and/or membrane component 106) of the sensor component 100 to increase the output signal (e.g., sensor signal) of the force sensing module and/or reduce the amount of electrical noise in the output signal (wherein the electrical noise can interfere with the sensor signal and sensor data therein).

It is to be appreciated and understood that, while the disclosed subject matter describes reducing the amount of roughness of a surface 110 of an electrode component 102 and/or altering a shape of the surface 110, the disclosed subject matter is not so limited. In some embodiments, it can be desired to form striations (e.g., ridges, grooves, furrows, channels, or linear markings) and/or a pattern in or on the surface 110 of the electrode component 102 to create the processed surface 108, and the techniques, processes, and components of the disclosed subject matter can be utilized to process the surface 110 to form the desired striations and/or pattern in or on the surface 110 to create the processed surface 108 of the electrode component 102.

In some embodiments, the processing of the surface 110 of the electrode component 102 to create the processed surface 108 can be performed using an abrasive material on the surface 110 of the electrode component 102. The abrasive material can comprise, for example, sandpaper, diamond or other type of abrasive paste, or a polishing cloth having a desired amount of abrasiveness. Different abrasive processing techniques or different abrasive materials can produce different results with regard to smoothing (e.g., reducing the roughness) of the surface 110 of the electrode component 102 and/or shaping of the surface 110 to create the processed surface 108. For example, applying a higher amount of pressure while sanding the surface 110 can result, or at least likely can result (e.g., depending on other factors), in an increase in the rounding (e.g., doming) of the surface.

As another example, using a relatively softer material, such as a relatively more compliant or compressible material, on the backside of the abrasive material during application of the abrasive material to the surface 110 also can increase, or at least likely can result in an increase in, the rounding of the surface, as more fully described herein. For instance, a softer material, such as, for example, a material with a lower Young's modulus and/or a lower Poisson's ratio, which can translate to more compliant material and more compressible material, respectively, can increase, or at least can be likely to increase, the rounding of the surface. Conversely, using a relatively harder material, which is relatively less compliant or compressible, on the backside of the abrasive material during application of the abrasive material to the surface 110 can result, or can be likely to result, in relatively less rounding of the surface.

As still another example, applying a relatively lower amount of pressure while sanding the surface 110 can result, or at least likely can result (e.g., depending on other factors), in reducing the roughness of the electrode surface to smooth out the surface while resulting in no or a relatively small amount of rounding (e.g., doming) of the surface. As still another example, different types of sandpapers having different grits (e.g., higher grit, lower grit, . . . ) can result in different modifications of the surface 110 to create the processed surface 108, wherein, for example, using a sandpaper having a finer grit on the surface 110 can produce, or likely can produce, a smoother processed surface 108 than if sandpaper having a coarser grit is used on the surface 110. As still another example, applying a light pressure to the surface 110, and/or applying such light pressure for a relatively short time to the surface 110, can result, or at least is likely to result, in removing protruding nodules (e.g., significantly sized nodules) from the surface, while not significantly (e.g., relatively speaking) reducing the roughness of the surface or causing rounding (e.g., doming) of the surface.

In some embodiments, electrode components (e.g., 102) can be formed on a PCB. For instance, the electrode components (e.g., 102) can be formed on a substrate of the PCB, wherein the substrate can be formed of a desired material (e.g., desired non-conductive material, such as a dielectric material (e.g., FR-4)). In other embodiments, rather than forming electrodes on a PCB, electrode components (e.g., 102) can be formed on another type of substrate that can be, for example, a plastic, nonwoven, or cellulose-based material, wherein such other type of substrate can be rigid or can be relatively flexible.

A PCB (e.g., the substrate of the PCB) frequently can have certain imperfections, such as a bowing of the PCB and/or ripples or ridges on the surface of the PCB. Such imperfections can cause the PCB to not be suitably or completely flat when laid on another surface to process the surfaces (e.g., 110) of the electrode components (e.g., 102). In some embodiments, to facilitate desirable contact with and processing (e.g., modifying) of the surfaces (e.g., 110) of the electrode components (e.g., 102) on a PCB, a flexible and/or compressible backing or support material can be applied to the back (e.g., non-abrasive side) of the abrasive material (e.g., sandpaper). The flexible and/or compressible backing or support material can comprise, for example, a rubber or other polymer material, a foam material, or other type of flexible and/or compressible material. During processing of the electrode surfaces, instead of the force or pressure being applied directly to the back side of the abrasive material, the force or pressure can be applied directly to the flexible and/or compressible backing or support material, and the flexible and/or compressible backing or support material can desirably transfer or distribute that force or pressure to the back side of the abrasive material and/or can enable the abrasive material (e.g., sandpaper) to be flexible with regard to its contact with the surfaces (e.g., 110) of the electrode components (e.g., 102) on the PCB. Such flexible and/or compressible backing or support material can enable the abrasive material to desirably contact, and maintain contact, with the surfaces of the electrode components on the PCB during the processing of the surfaces of the electrode components.

For instance, the flexible and/or compressible backing or support material can enable the abrasive material (e.g., sandpaper) to be molded or shaped, or at least somewhat (e.g., partially) molded or shaped (e.g., contoured), to account for (e.g., to conform to) the imperfections of the PCB and maintain desirable contact with the surfaces of the electrode components on the PCB.

In some instances, the PCB can be a flexible PCB that can deflect or potentially deflect significantly during the processing of the surfaces (e.g., 110) of the electrode components (e.g., 102) on the PCB. Further, it can be desirable to hold the PCB stationary during the processing of the surfaces of the electrode components on the PCB.

In certain embodiments, a vacuum chuck component can be employed to hold the PCB in a desirably (e.g., suitably) flat and stationary position during the processing (e.g., modifying) of the surfaces (e.g., 110) of the electrode components (e.g., 102). For instance, the PCB can be placed on a flat surface of the vacuum chuck component, wherein the flat surface can be associated with a vacuum (e.g., vacuum component) and can comprise holes, grooves, or other type of vacuum chuck surface that can enable the vacuum force from the vacuum to be applied to the bottom surface of the PCB (e.g., on the opposite side of the top surface where the electrode components are located) to hold the PCB in a desirably flat and stationary position during processing of the surfaces of the electrode components on the PCB.

In other embodiments, an adhesive material (e.g., a temporary adhesive) can be utilized to temporarily hold the PCB (e.g., flexible PCB) in a desirably (e.g., suitably) flat and stationary position during the processing (e.g., modifying) of the surfaces (e.g., 110) of the electrode components (e.g., 102). For example, a desired adhesive material can be applied to the bottom surface of the PCB and/or to a flat surface (e.g., a flat surface of a surface component), and the bottom surface of the PCB can be placed on the flat surface, wherein the adhesive material can hold the PCB in a desirably flat and stationary position during the processing of the surfaces of the electrode components. After processing of the electrode surfaces, the PCB can be removed from the flat surface. In some embodiments, with regard to certain types of temporary adhesives, a deactivating material or process can be employed to deactivate or discontinue the adhesive properties of the adhesive material to enable the PCB to be removed from the flat surface.

It is to be appreciated and understood that, while various embodiments (e.g., embodiments relating to the backing or support material, vacuum chuck component, and adhesive material) have been described herein with regard to a PCB, the disclosed subject matter (e.g., the backing or support material, the vacuum chuck component, and the adhesive material) also can be utilized with regard to other types of substrates, such as those described herein, for example.

In certain embodiments, the processing of the surface 110 to create the processed surface 108 can be performed using chemical polishing and/or etching (e.g., copper or aluminum etching) using desired chemical materials, which can comprise, for example, acid type chemicals. Different chemical processing techniques (e.g., different chemical etching or polishing techniques) or different chemical materials can produce different results with regard to smoothing (e.g., reducing the roughness) of the surface 110 of the electrode component 102 and/or shaping of the surface 110 to create the processed surface 108. As an example, performing a more aggressive copper (or aluminum) etching on the surface 110 can result, or at least can be likely to result, in a processed surface 108 that can have relatively more rounding (e.g., doming) than if a less aggressive copper (or aluminum) etching is performed on the surface 110. As another example, performing a relatively more gentle copper (or aluminum) etching on the surface 110 can result, or at least can be likely to result, in a processed surface 108 that can have a reduced roughness without significant rounding of the processed surface 108 than if a less gentle (e.g., more aggressive) copper (or aluminum) etching is performed on the surface 110.

Figure 2:
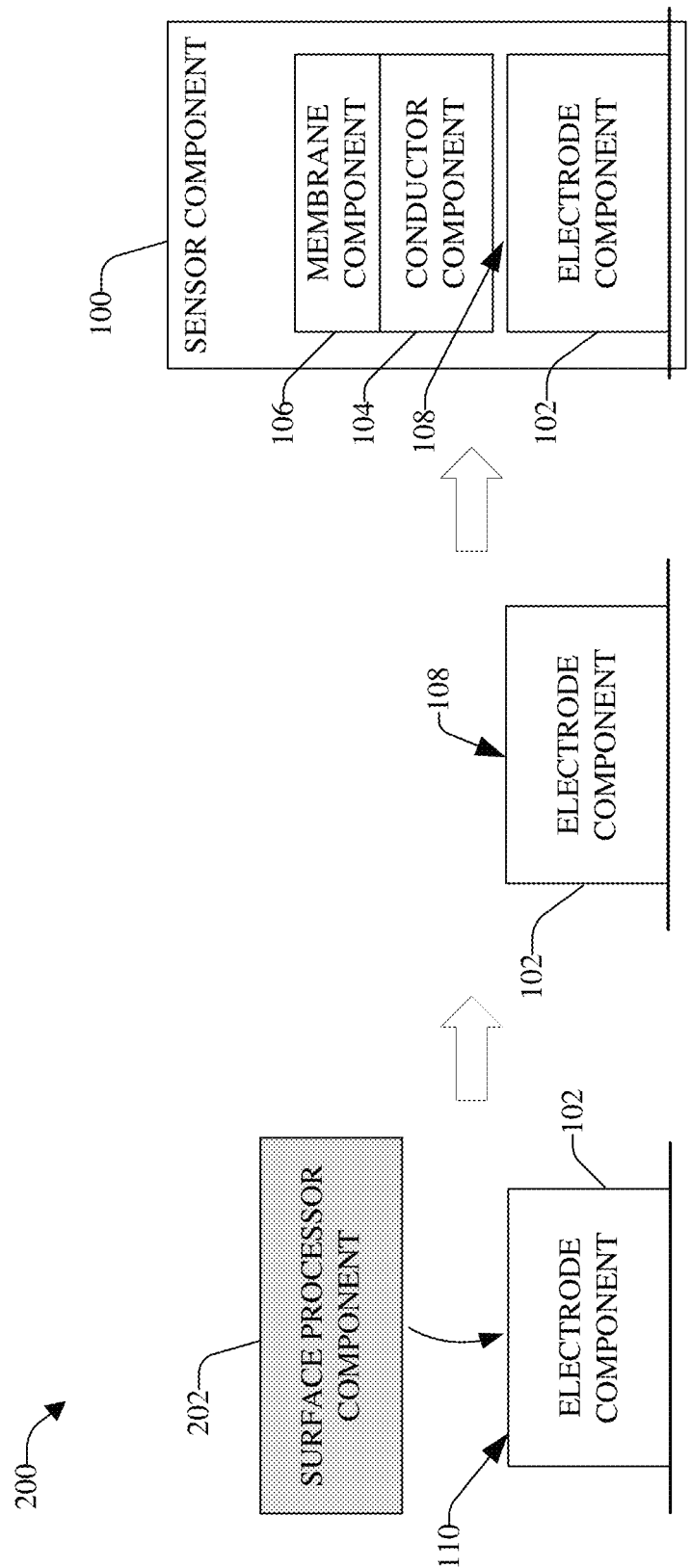
FIG. 2 depicts a block diagram of an example system that can comprise a surface processor component that can process electrode surfaces of electrodes of sensor components to facilitate enhancing operation and performance of sensor components, in accordance with various aspects and embodiments of the disclosed subject matter.

Referring to FIG. 2 (along with FIG. 1), FIG. 2 depicts a block diagram of an example system 200 that can comprise a surface processor component that can process electrode surfaces of electrodes of sensor components to facilitate enhancing operation and performance of sensor components, in accordance with various aspects and embodiments of the disclosed subject matter. The system 200 can comprise a surface processor component 202 that can be utilized during the manufacturing process to manufacture sensor components, such as sensor component 100.

The surface processor component 202 can perform (e.g., automatically perform) desired surface processes on the surfaces (e.g., top surface pads) of the electrode component 102 of the sensor component 100 to modify the surface 110 (e.g., unprocessed surfaces) to smooth the surface 110 of the electrode component 102 and/or shape (e.g., round) the surface 110 of the electrode component 102 to create the processed electrode surface 108, which can enhance the operation and performance of the sensor component 100, as more fully described herein. For instance, the surface processor component 202 can perform (e.g., automatically perform) the abrasive processing techniques or processes (e.g., abrasive sanding, polishing, . . . ), and/or the chemical processing techniques or processes (e.g., chemical etching or polishing), such as more fully described herein, to modify the surface 110 to reduce the amount of roughness of the surface 110 and/or to change the shape of the surface 110 (e.g., to produce a rounded profile of the top surface) of the electrode component 102 to produce the desirably processed electrode surface 108 (e.g., the desirably smooth and/or rounded surface), in accordance with the defined surface processing criteria.

In some embodiments, the surface processor component 202 can sense or measure (e.g., using a sensor(s)), and/or can determine (e.g., automatically determine), the roughness and/or shape of the surface of the electrode component 102 before, during, and/or after processing or modifying (e.g., initial or intermediate processing or modifying) of the surface of the electrode component 102 to determine the progress of the processing or modifying of the electrode surface, determine the level of roughness of the electrode surface, determine the level of roundness of the electrode surface, and/or determine whether the electrode surface has been processed or modified to satisfy the defined surface processing criteria (e.g., determine whether the electrode surface has been desirably (e.g., suitably, optimally, or acceptably) processed or modified, in accordance with the defined surface processing criteria). During the surface processing, if (e.g., based on analysis of sensor data from the sensor(s)) the surface processor component 202 determines that the roughness of the electrode surface has not been sufficiently reduced and/or the electrode surface is not desirably shaped to satisfy the defined surface processing criteria, the surface processor component 202 can determine (e.g., automatically determine) that further processing of the electrode surface is to be performed and can continue processing the electrode surface to achieve the desired reduction in surface roughness and/or surface shaping of the electrode surface to satisfy the defined surface processing criteria. If the surface processor component 202 determines that the roughness of the electrode surface has been sufficiently reduced and/or the electrode surface has been desirably shaped to satisfy the defined surface processing criteria, the surface processor component 202 can determine (e.g., automatically determine) that the desired processed surface 108 has been achieved and can end surface processing of the electrode surface of the electrode component 102.

During manufacture and processing of the electrode component 102 (e.g., if the electrode component 102 is formed on a PCB, such as, for example a flexible PCB), the surface processor component 202 also can employ a vacuum chuck component or an adhesive component (e.g., to apply a temporary adhesive to a PCB on which the electrode component 102 is formed) to hold or maintain the PCB in suitably flat and stationary position to facilitate the processing (e.g., modifying) of the surface of the electrode component 102 (and/or other surfaces of other electrode components on the PCB) by the surface processor component 202, as more fully described herein.

In other embodiments, the surface processor component 202 can utilize a suitably flexible and/or compressible support material (e.g., rubber or foam material) that can be applied to the back side of an abrasive material, such as sandpaper, during processing of the electrode surface (e.g., 110) using the abrasive material. The surface processor component 202 can apply a desired (e.g., suitable) force to the flexible and/or compressible support material, which can desirably distribute or transfer all or a portion of the force to the abrasive material, and/or can facilitate the molding or shaping of the sandpaper to enable the sandpaper to maintain desirable contact with the electrode surface (e.g., 110) (and/or other electrode surfaces of other electrode components on the PCB) during surface processing of the electrode surface (and/or the other electrode surfaces), as more fully described herein.

Once the electrode surface is suitably processed to achieve the processed surface 108, the manufacturing of the sensor component 100 (and/or other sensor components on the PCB) can continue. This can include, for example, forming, placing, or constructing a conductor component 104 (e.g., conductive layer) that can be on or in proximity to the processed surface 108 of the electrode component 102 and/or a membrane component 106 (e.g., flexible membrane) that can be formed on (or integrated with) the conductor component 104, as more fully described herein.

Other processing (e.g., pre-processing or post-processing) operations can be performed as well. For example, holes can be drilled in the surfaces (e.g., 110) of the electrode components (e.g., 102) to facilitate enabling electrical connections to be made to the electrode components via the holes. Planarizing of the electrode components or other components (e.g., on the PCB) can be performed, for example, to remove burrs or debris that may have formed on the PCB as a result of the drilling of the holes. Electroplating also can be performed to deposit a thin layer of conductive metal over desired portions of the PCB, which can include electrode components on the PCB, to facilitate creating other electrical connections between layers or components of the PCB. Generally, the surface processing of the electrode surfaces (e.g., 110) of the electrode components (e.g., 102) can be performed after the drilling of the holes, planarizing, and/or electroplating is performed on the PCB, although the performance of the respective processing operations can vary, as desired.

In some embodiments, another electroplating process can be performed to deposit a thin layer of anti-corrosion (e.g., anti-oxidant) conductive material (e.g., gold, silver, nickel, . . . , and/or their alloys, and/or combinations thereof) onto the electrode components (e.g., 102). The surface processing (e.g., by the surface processor component 202) of the surfaces (e.g., 110) of the electrode components (e.g., 102) can be performed prior to, or after, such other electroplating process is performed, as desired. If the surface processing is performed before such other electroplating process is performed, the processed surfaces (e.g., 108) of the electrode components (e.g., 102) on which the thin layer of anti-corrosion conductive material is electroplated or deposited will be desirably smooth and/or shaped, and the thin layer of anti-corrosion conductive material deposited on the processed surfaces (e.g., 108) generally will not significantly alter the level of smoothness and/or the shape of the processed surfaces (e.g., 108) with the additional thin layer thereon. If the surface processing is performed after such other electroplating process is performed, the surface processing of the electrode surfaces (e.g., 110) can result in a portion of the anti-corrosion conductive material being removed as the electrode surfaces are smoothed and/or shaped to produce processed surfaces (e.g., 108). However, there typically can remain a sufficient portion of the thin layer of anti-corrosion conductive material to enable the processed surfaces (e.g., 108) to enable the processed electrode surfaces to still be sufficiently resistant to corrosion or oxidation.

FIGS. 3-7 depicts diagrams of example non-limiting electrode patterns of electrodes that can be formed on PCBs, wherein the electrodes can have the surfaces (e.g., top surfaces) of the electrodes processed (e.g., modified) to smooth and/or shape the surfaces, in accordance with various aspects and embodiments of the disclosed subject matter. The electrodes formed on these PCBs can be manufactured and processed in connection with manufacturing sensor components (e.g., sensors) comprising the electrodes. The electrodes formed on the PCBs, the channels formed between the electrodes on the PCBs, the holes formed in the electrodes, and/or other features of the PCBs can be formed using desired sensor fabrication techniques and processes.

Figure 3:
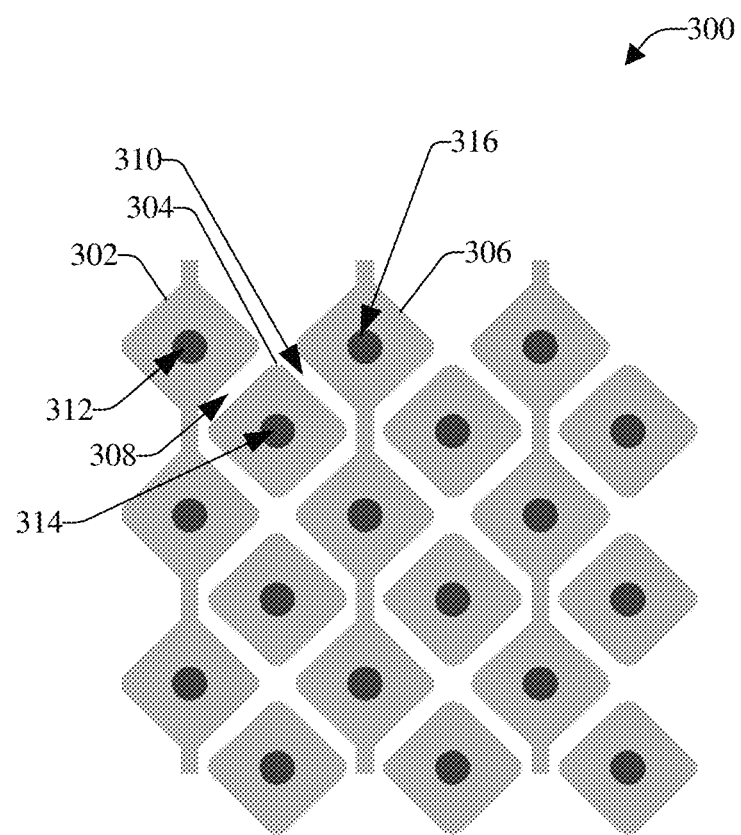
FIG. 3 presents a diagram of an example, non-limiting electrode pattern comprising a set of electrode components that can be formed on a printed circuit board (PCB) in a diamond pattern, in accordance with various aspects and embodiments of the disclosed subject matter.

FIG. 3 presents a diagram of an example, non-limiting electrode pattern 300 comprising a set of electrode components that can be formed on the PCB in a diamond pattern, in accordance with various aspects and embodiments of the disclosed subject matter. The set of electrode components can comprise a plurality of electrode components, including, for example, electrode component 302, electrode 304, and electrode 306, wherein the electrode components (e.g., 302, 304, 306, . . . ) can be formed on the PCB to have the respective electrode components formed in a diamond shape, or at least a substantially diamond shape, wherein channels (e.g., 308, 310, . . . ) can be formed between the respective electrode components to facilitate creating the electrode components and creating non-conductive barriers (e.g., channels) between respective electrode components. The respective electrode components (e.g., 302, 304, 306, . . . ) can have respective holes (e.g., 312, 314, 316, . . . ) formed in them, wherein the respective holes (e.g., vias) can be utilized to make electrical connections with other components (e.g., wires, electronic components, . . . ) of the electronic circuit formed on the PCB. The diamond-shaped pattern of the electrodes of the electrode pattern 300 can facilitate creating a relatively compact set of electrode components on the PCB, as a portion (e.g., side portion) of a diamond-shaped electrode component can be situated in a space between two other diamond-shaped electrode components.

The surface processing techniques or processes (e.g., the abrasive processing techniques or processes (e.g., sanding, abrasive polishing, . . . ), the chemical processing techniques or processes (e.g., chemical etching or polishing)) described herein can be performed (e.g., by the surface processor component 202) to process (e.g., modify) the surfaces of the electrode components (e.g., 302, 304, 306, . . . ) to smooth the surfaces of the electrode components and/or shape the surfaces of the electrode components to create processed surfaces on the electrode components, in accordance with the defined surface processing criteria, as more fully disclosed herein.

Figure 4:
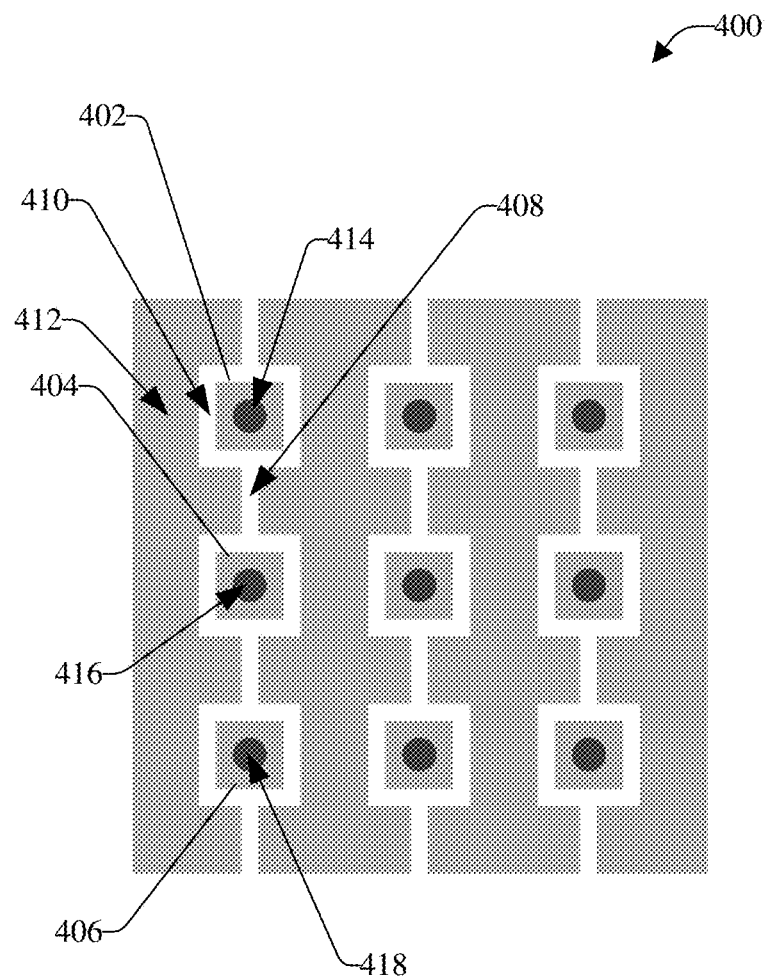
FIG. 4 illustrates a diagram of an example, non-limiting electrode pattern comprising a set of electrode components that can be formed on the PCB in a column and/or row-type pattern, in accordance with various aspects and embodiments of the disclosed subject matter.

FIG. 4 illustrates a diagram of an example, non-limiting electrode pattern 400 comprising a set of electrode components that can be formed on the PCB in a column and/or row-type pattern, in accordance with various aspects and embodiments of the disclosed subject matter. The set of electrode components can comprise a plurality of electrode components, including, for example, electrode component 402, electrode 404, and electrode 406, wherein the electrode components (e.g., 402, 404, 406, . . . ) can be formed on the PCB to have the respective electrode components formed in relation to each other to form columns and/or rows of electrode components, wherein channels (e.g., 408, 410, . . . ) can be formed between the respective electrode components and between other portions (e.g., other electrode components (e.g., 412) that do not have vias) of the PCB to facilitate creating the electrode components and creating non-conductive barriers (e g., channels) between respective electrode components of the PCB. The respective electrode components (e.g., 402, 404, 406, . . . ) can have respective holes (e.g., 414, 416, 418, . . . ) formed in them, wherein the respective holes (e.g., vias) can be utilized to make electrical connections with other components (e.g., wires, electronic components, . . . ) of the electronic circuit formed on the PCB.

The surface processing techniques or processes (e.g., the abrasive processing techniques or processes (e.g., sanding, abrasive polishing, . . . ), the chemical processing techniques or processes (e.g., chemical etching or polishing)) described herein can be performed (e.g., by the surface processor component 202) to process (e.g., modify) the surfaces of the electrode components (e.g., 402, 404, 406, . . . ) to smooth (e.g., reduce the roughness) the surfaces of the electrode components and/or shape the surfaces of the electrode components to create processed surfaces on the electrode components, in accordance with the defined surface processing criteria, as more fully disclosed herein.

Figure 5:
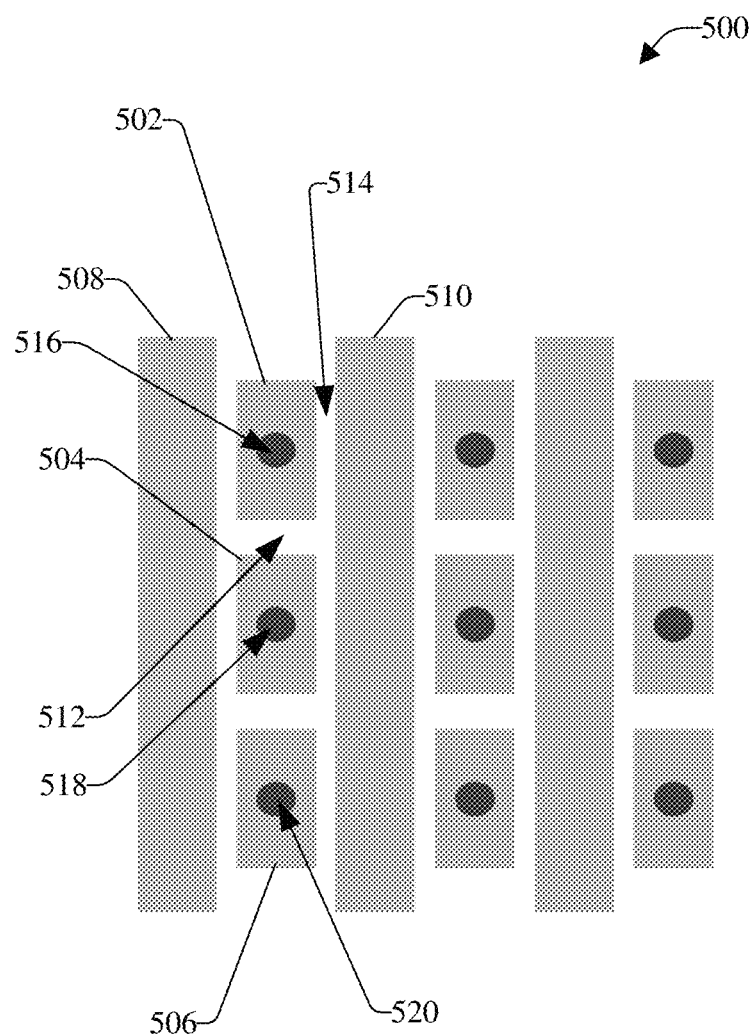
FIG. 5 depicts a diagram of an example, non-limiting electrode pattern comprising a set of electrode components that can be formed on the PCB in a different column and/or row-type pattern, in accordance with various aspects and embodiments of the disclosed subject matter.

Referring briefly to FIG. 5, FIG. 5 depicts a diagram of an example, non-limiting electrode pattern 500 comprising a set of electrode components that can be formed on the PCB in a different column and/or row-type pattern, in accordance with various aspects and embodiments of the disclosed subject matter. The set of electrode components can comprise a plurality of electrode components, including, for example, electrode component 502, electrode 504, and electrode 506, wherein the electrode components (e.g., 502, 504, 506, . . . ) can be formed on the PCB to have the respective electrode components formed in relation to each other to form columns and/or rows of electrode components that can be separated by or situated in between other portions (e.g., other conductive portions, such as other (e.g., different) electrode components 508, 510, . . . ) of the PCB, wherein channels (e.g., 512, 514, . . . ) can be formed between the respective electrode components and between the other portions (e.g., the other electrode components (e.g., 508, 510, . . . )) of the PCB to facilitate creating the electrode components and creating non-conductive barriers (e.g., channels) between respective electrode components and/or between electrode components (e.g., 502, 504, 506, . . . ) and the other electrode components (e.g., 508, 510, . . . ) of the PCB. The respective electrode components (e.g., 502, 504, 506, . . . ) can have respective holes (e.g., 516, 518, 520, . . . ) formed in them, wherein the respective holes (e.g., vias) can be utilized to make electrical connections with other components (e.g., wires, electronic components, . . . ) of the electronic circuit formed on the PCB. In some embodiments (e.g., as depicted in FIG. 5), the other electrode components (e.g., 508, 510, . . . ) can be configured to not have holes formed therein and/or to be larger in size than the electrode components (e.g., 502, 504, 506, . . . ). However, in other embodiments, if and as desired, the other electrode components (e.g., 508, 510, . . . ) can have holes formed in them and/or can be differently sized to be smaller than or the same size as the electrode components (e.g., 502, 504, 506, . . . ).

The surface processing techniques or processes (e.g., the abrasive processing techniques or processes (e.g., sanding, abrasive polishing, . . . ), the chemical processing techniques or processes (e.g., chemical etching or polishing)) described herein can be performed (e.g., by the surface processor component 202) to process (e.g., modify) the surfaces of the electrode components (e.g., 502, 504, 506, . . . ) to smooth (e.g., reduce the roughness) the surfaces of the electrode components and/or shape the surfaces of the electrode components to create processed surfaces on the electrode components, in accordance with the defined surface processing criteria, as more fully disclosed herein.

Figure 6:
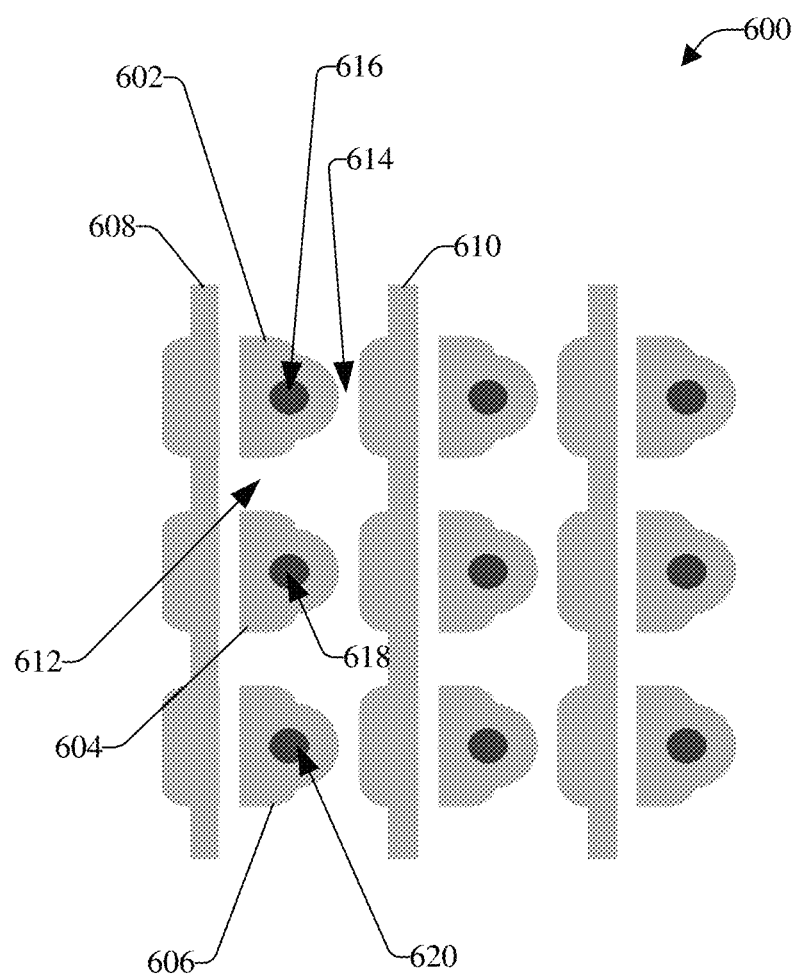
FIG. 6 illustrates a diagram of an example, non-limiting electrode pattern comprising a set of electrode components that can be formed on the PCB in a column and/or row-type pattern and to be irregularly shaped, in accordance with various aspects and embodiments of the disclosed subject matter.

Turning briefly to FIG. 6, FIG. 6 illustrates a diagram of an example, non-limiting electrode pattern 600 comprising a set of electrode components that can be formed on the PCB in a column and/or row-type pattern and to be irregularly shaped, in accordance with various aspects and embodiments of the disclosed subject matter. The set of electrode components can comprise a plurality of electrode components, including, for example, electrode component 602, electrode 604, and electrode 606, wherein the electrode components (e.g., 602, 604, 606, . . . ) can be formed on the PCB to have the respective electrode components formed in relation to each other to form columns and/or rows of electrode components that can be separated by or situated in between other portions (e.g., other irregularly shaped conductive portions, such as the other electrode components 608, 610, . . . ) of the PCB. The electrode components (e.g., 602, 604, 606, . . . ) can be formed to have an irregular shape. For example, as depicted, the electrode components (e.g., 602, 604, 606, . . . ) can be formed to have a bell-like shape, wherein an electrode component can have a wider portion that can be associated with (e.g., formed or integrated with) a semi-circular portion that can be more narrow in size (e.g., width) relative to the wider portion.

Channels (e.g., 612, 614, . . . ) can be formed between the respective electrode components (e.g., 602, 604, 606, . . . ) and between the other conductive portions (e.g., the other irregularly shaped electrode components (e.g., 608, 610, . . . )) of the PCB to facilitate creating the electrode components and creating non-conductive barriers (e.g., channels) between respective electrode components and/or between electrode components and the other conductive portions of the PCB. The respective electrode components (e.g., 602, 604, 606, . . . ) can have respective holes (e.g., 616, 618, 620, . . . ) formed in them, wherein the respective holes can be utilized to make electrical connections with other components (e.g., wires, electronic components, . . . ) of the electronic circuit formed on the PCB. In some embodiments (e.g., as depicted), the other electrode components (e.g., 608, 610, . . . ) can be structured to not have holes formed in them, although in other embodiments, if and as desired, holes also can be formed in the other electrode components (e.g., 608, 610, . . . ).

Similar to FIGS. 3-5, the surface processing techniques or processes (e.g., the abrasive processing techniques or processes (e.g., sanding, abrasive polishing, . . . ), the chemical processing techniques or processes (e.g., chemical etching or polishing)) described herein can be performed (e.g., by the surface processor component 202) to process (e.g., modify) the surfaces of the electrode components (e.g., 602, 604, 606, . . . ) to smooth (e.g., reduce the roughness) the surfaces of the electrode components and/or shape (e.g., round out) the surfaces of the electrode components to create processed surfaces on the electrode components, in accordance with the defined surface processing criteria, as more fully disclosed herein.

Figure 7:
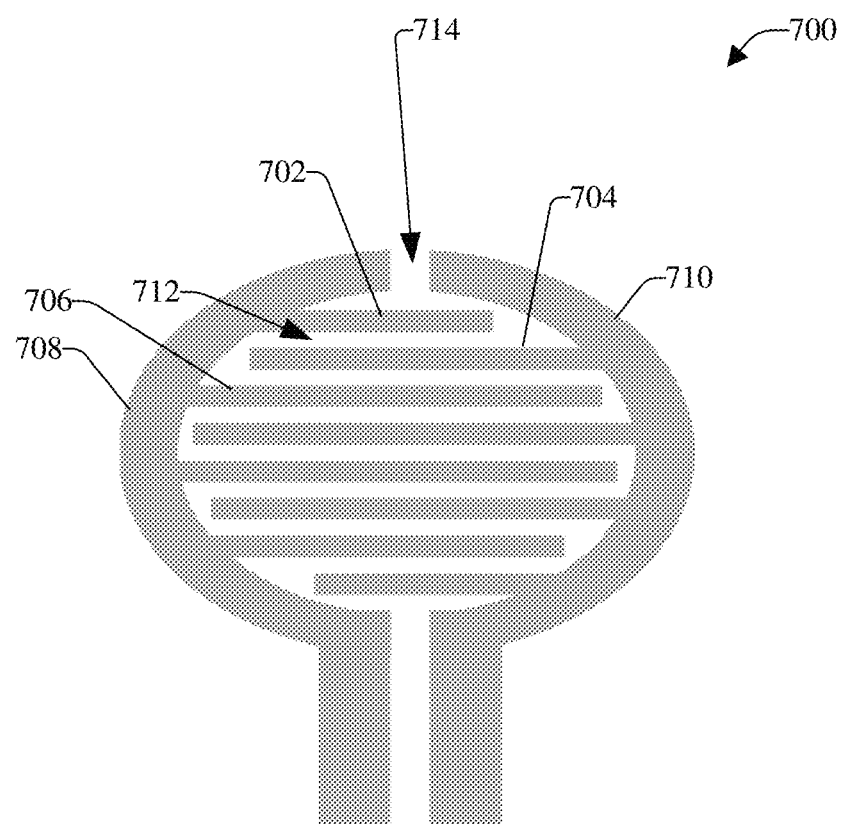
FIG. 7 presents a diagram of an example, non-limiting electrode pattern comprising a set of electrode components that can be formed on the PCB in a staggered pattern, in accordance with various aspects and embodiments of the disclosed subject matter.

FIG. 7 presents a diagram of an example, non-limiting electrode pattern 700 comprising a set of electrode components that can be formed on the PCB in a staggered pattern, in accordance with various aspects and embodiments of the disclosed subject matter. The set of electrode components can comprise a plurality of electrode components, including, for example, electrode component 702, electrode 704, and electrode 706, wherein the electrode components (e.g., 702, 704, 706, . . . ) can be formed on the PCB to have the respective electrode components formed in relation to each other to be in a staggered pattern, wherein a portion of the electrode components (e.g., 702, 706) can extend from an underside or inside surface of a semi-circular portion 708 on one side of the PCB and another portion of the electrode components (e.g., 704) can extend from an underside or inside surface of another semi-circular portion 710 on the other side (e.g., opposite side) of the PCB, wherein, for example, the electrode component 704 can be situated between the electrode components 702 and 706.

Channels (e.g., 712, 714, . . . ) can be formed between the respective electrode components (e.g., 702, 704, 706, . . . ) and between the other conductive portions (e.g., the semi-circular portions (e.g., 708, 710, . . . )) of the PCB to facilitate creating the electrode components and creating non-conductive barriers (e g., channels) between respective electrode components and/or between electrode components and the other conductive portions of the PCB. In some embodiments, the respective electrode components (e.g., 702, 704, 706, . . . ) can have respective holes (not shown in FIG. 7) formed in them, wherein the respective holes can be utilized to make electrical connections with other components (e.g., wires, electronic components, . . . ) of the electronic circuit formed on the PCB.

Similar to FIGS. 3-6, the surface processing techniques or processes (e.g., the abrasive processing techniques or processes (e.g., sanding, abrasive polishing, . . . ), the chemical processing techniques or processes (e.g., chemical etching or polishing)) described herein can be performed (e.g., by the surface processor component 202) to process (e.g., modify) the surfaces of the electrode components (e.g., 702, 704, 706, . . . ) to smooth (e.g., reduce the roughness) the surfaces of the electrode components and/or shape (e.g., round out) the surfaces of the electrode components to create processed surfaces on the electrode components, in accordance with the defined surface processing criteria, as more fully disclosed herein.

Figure 8:
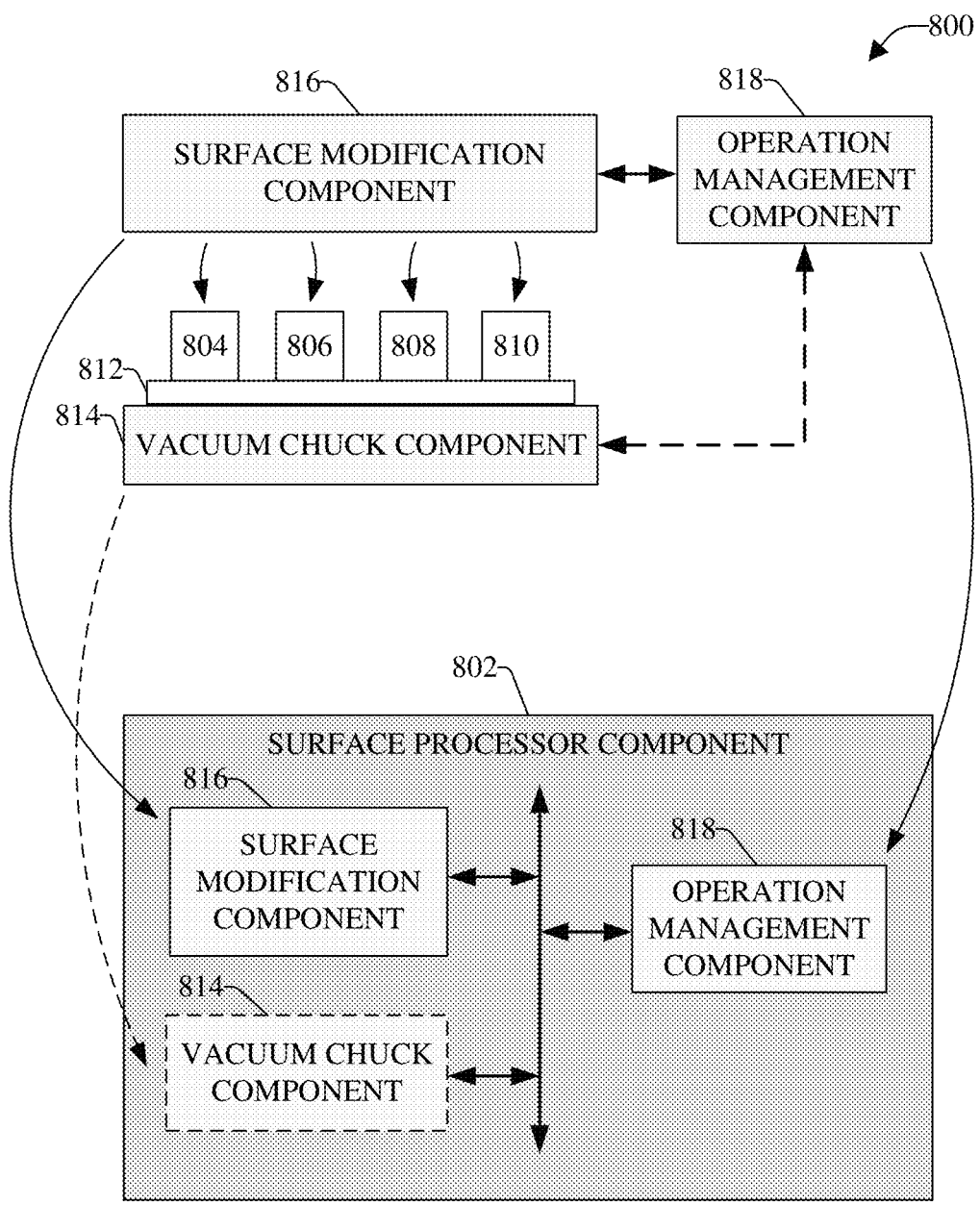
FIG. 8 depicts a block diagram of an example system that can comprise a surface processor component that can employ a vacuum chuck component to facilitate retaining a PCB, comprising electrode components, in place during processing of electrode surfaces of the electrode components of sensor components to facilitate enhancing operation and performance of sensor components, in accordance with various aspects and embodiments of the disclosed subject matter.

FIG. 8 depicts a block diagram of an example system 800 that can comprise a surface processor component that can employ a vacuum chuck component to facilitate retaining a PCB, comprising electrode components, in place during processing of electrode surfaces of the electrode components of sensor components to facilitate enhancing operation and performance of sensor components, in accordance with various aspects and embodiments of the disclosed subject matter. The system 800 can comprise a surface processor component 802 that can perform desired surface processes on the surfaces (e.g., top surface pads) of electrode components, such as electrode components 804, 806, 808, and 810, that are formed on a PCB 812, wherein the electrode components (e.g., 804, 806, 808, 810) will be part of sensor components. The surface processor component 802 can perform the desired surface processes (e.g., surface smoothing process, surface rounding process) on the surfaces (e.g., top surface pads) of the electrode components (e.g., 804, 806, 808, 810) to modify the respective surfaces (e.g., unprocessed surfaces) to smooth the surfaces and/or shape (e.g., round) the surfaces of the electrode components to create processed electrode surfaces that can enhance the operation and performance of the electrode components and, accordingly, the sensor components in which the electrode components will be employed. For instance, the surface processor component 802 can perform the abrasive processing techniques or processes (e.g., abrasive sanding, polishing, . . . ), and/or the chemical processing techniques or processes (e.g., chemical etching or polishing), such as described herein, to modify (e.g., smooth and/or round) the respective surfaces of the electrode components (e.g., 804, 806, 808, 810), as more fully described herein.

In some instances, the PCB 812 can be a flexible PCB that can deflect significantly during the processing of the surfaces of the electrode components (e.g., 804, 806, 808, 810) on the PCB 812. Further, it can be desirable to hold the PCB 812 stationary during the processing of the surfaces of the electrode components (e.g., 804, 806, 808, 810) on the PCB 812.

To address and overcome these potential issues regarding a PCB 812 (e.g., flexible PCB) and associated electrode components (e.g., 804, 806, 808, 810), and to facilitate further enhancing the processing of surfaces of the electrode components, in accordance with various embodiments, the surface processor component 802 can comprise or be associated with a vacuum chuck component 814 that can utilize vacuum air pressure to generate a suitable and sufficient downward holding force (e.g., a vacuum force) that can hold (e.g., retain) the PCB 812 suitably flat and stationary when the PCB 812 is placed on the vacuum chuck surface of the vacuum chuck component 814 and the vacuum chuck component 814 is activated to generate the vacuum.

The surface processor component 802 also can include a surface modification component 816 that can be employed to process and modify the surfaces of the electrode components (e.g., 804, 806, 808, 810) on the PCB 812, for example, when the PCB 812 is being retained in place by the vacuum chuck component 814. For instance, the surface modification component 816 can utilize the desired surface processes (e.g., surface smoothing process, surface rounding process) on the surfaces (e.g., top surface pads) of the electrode components (e.g., 804, 806, 808, 810) to modify the surfaces to smooth (e.g., reduce roughness of) the surfaces and/or shape (e.g., round) the surfaces of the electrode components to create the processed electrode surfaces on the electrode components. For example, the surface modification component 816 can use the abrasive and/or chemical techniques and processes, as described herein, to process and modify the surfaces of the electrode components (e.g., 804, 806, 808, 810).

The surface processor component 802 also can comprise an operation management component 818 that can control operations (e.g., performance of operations) of the surface processor component 802, including the respective operations of the respective components (e.g., surface modification component 816 and/or vacuum chuck component 814) of the surface processor component 802, in accordance with the defined surface processing criteria. The operation management component 818 can be associated with (e.g., communicatively connected to) the various components (e.g., surface modification component 816 and/or vacuum chuck component 814) of the surface processor component 802. The operation management component 818 can determine suitable instructions that are to be provided to the various components to have the various components perform desired operations, and can communicate respective suitable instructions to the respective components (e.g., surface modification component 816 and/or vacuum chuck component 814) of the surface processor component 802 for execution by the respective components to perform the desired operations.

Figure 9:
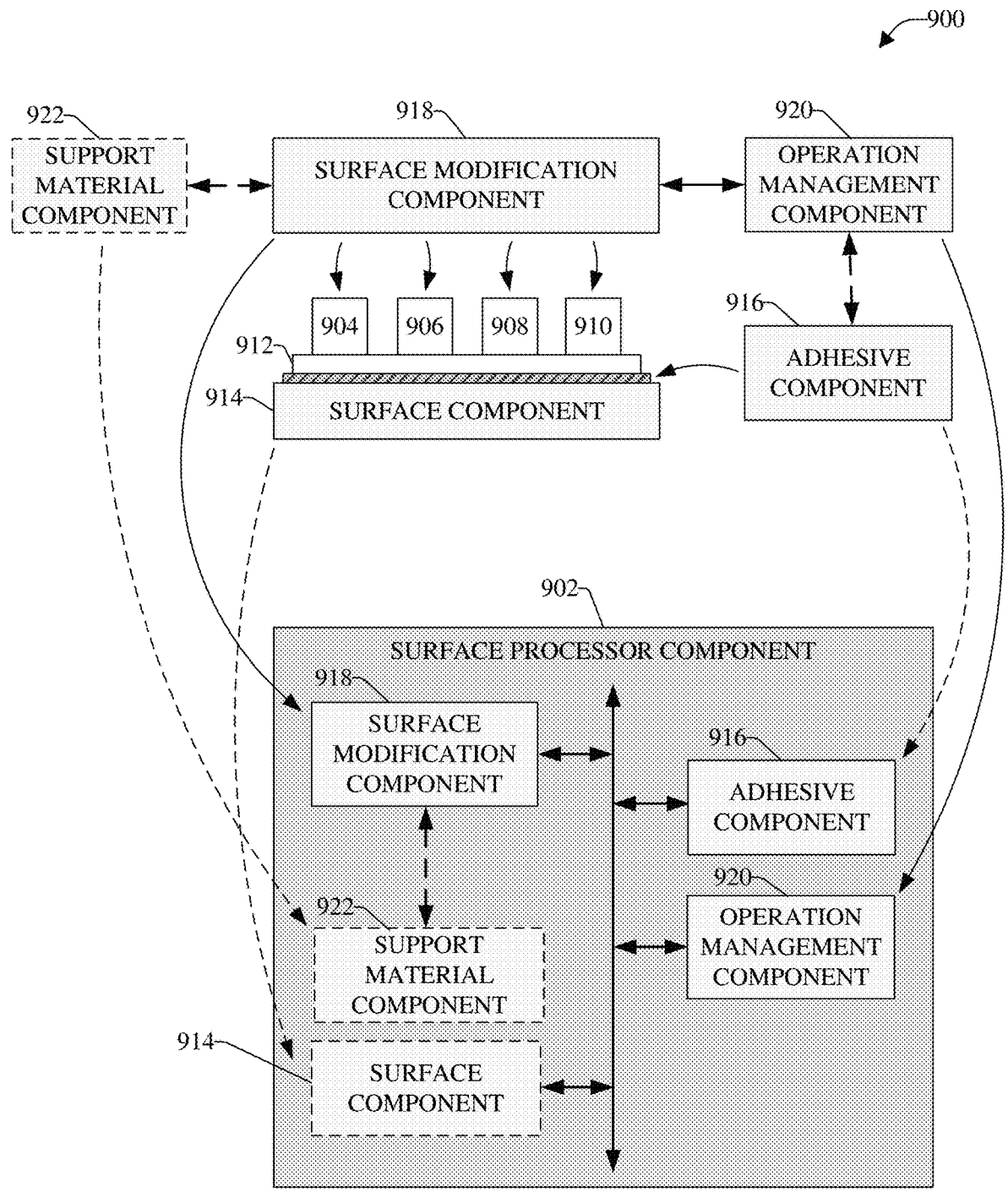
FIG. 9 illustrates a block diagram of an example system that can comprise an adhesive component that can utilize adhesives (e.g., temporary adhesives) to facilitate retaining a PCB, comprising electrodes, in place during processing of electrode surfaces of the electrodes of sensor components to facilitate enhancing operation and performance of the electrodes and associated sensor components, in accordance with various aspects and embodiments of the disclosed subject matter.

As an alternative to (or in addition to) using a vacuum chuck component 814 to hold a PCB 812 in a suitably flat and stationary position during processing of the surfaces of the electrode components (e.g., 804, 806, 808, 810), the disclosed subject matter can employ adhesive processes (e.g., temporary adhesive processes) to hold a PCB (e.g., flexible PCB) in a suitably flat and stationary position during processing of the surfaces of the electrode components. FIG. 9 illustrates a block diagram of an example system 900 that can comprise an adhesive component that can utilize adhesives (e.g., temporary adhesives) to facilitate retaining a PCB, comprising electrodes, in place during processing of electrode surfaces of the electrodes of sensor components to facilitate enhancing operation and performance of the electrodes and associated sensor components, in accordance with various aspects and embodiments of the disclosed subject matter. The system 900 can comprise a surface processor component 902 that can perform desired surface processes (e.g., surface smoothing process, surface rounding process) on the surfaces (e.g., top surface pads) of electrode components, such as electrode components 904, 906, 908, and 910, that are formed on a PCB 912, to modify the respective electrode surfaces (e.g., unprocessed surfaces) to smooth the surfaces and/or shape (e.g., round) the surfaces of the electrode components to create processed electrode surfaces. as more fully described herein. This can enhance the operation and performance of the electrode components and, accordingly, the sensor components in which the electrode components will be employed.

In some embodiments, the surface processor component 902 can comprise or be associated with a surface component 914, which can have a suitably flat and rigid surface and can be suitably large enough in size to lay one or more PCBs, such as PCB 912, on its suitably flat surface. The surface component 914 can be formed of any of a variety of materials, including, for example, metal, polymer, fiberglass, and/or wood.

In certain embodiments, the surface processor component 902 can comprise or be associated with an adhesive component 916 that can apply an adhesive material (e.g., a temporary adhesive material) to the flat, rigid surface of the surface component 914 and/or to the bottom surface of the PCB 912 (e.g., flexible PCB) to temporarily adhere the PCB 912 to the flat, rigid surface of the surface component 914 when the PCB 912 is placed on the flat, rigid surface to hold the PCB 912 stationary and suitably flat on the flat, rigid surface of the surface component 914. The adhesive component 916 can spray, spread, and/or otherwise deposit the adhesive material on the flat, rigid surface of the surface component 914 and/or to the bottom surface of the PCB 912. The adhesive material can comprise, for example, various types of glues, elastomers, silicone-based adhesives, and/or pressure sensitive adhesive tapes or films.

The surface processor component 902 also can include a surface modification component 918 that can be employed to process and modify the surfaces of the electrode components (e.g., 904, 906, 908, 910) on the PCB 912, as more fully described herein, for example, when the PCB 912 is being retained in place on the surface component 914 by the adhesive material applied by the adhesive component 916. The surface processor component 902 also can comprise an operation management component 920 that can control operations (e.g., performance of operations) of the surface processor component 902, including the respective operations of the respective components (e.g., surface modification component 918, the surface component 914, and/or the adhesive component 916) of the surface processor component 902, in accordance with the defined surface processing criteria, as more fully described herein.

In some embodiments, the PCB 912 can be relatively rigid (e.g., not flexible). However, the PCB 912 often can have certain imperfections, such as a certain amount of bowing of the PCB 912, and/or ripples or ridges on the surface of the PCB 912. This may cause the PCB 912 to not be suitably or completely flat when laid on another surface to process the electrode surfaces of the electrode components (e.g., 904, 906, 908, 910) and/or can potentially cause inconsistent (e.g., uneven) contact with the electrode surfaces and/or inconsistent processing of the electrode surfaces.

In some embodiments, to facilitate desirable contact with and processing (e.g., modifying) of the surfaces of the electrode components (e.g., 904, 906, 908, 910) on the PCB 912, the surface processor component 902 can comprise a support material component 922, which can comprise a flexible and/or compressible support material, that can be applied to the back (e.g., non-abrasive side) of an abrasive material, such as sandpaper. The support material component 922 can comprise, for example, a rubber or other polymer material, a foam material, or other type of flexible and/or compressible material. The PCB 912 can be laid on the surface component 914 (e.g., without using temporary adhesive material, or using temporary adhesive material, as desired). During processing of the surfaces of the electrode components (e.g., 904, 906, 908, 910) on the PCB 912, instead of the force or pressure being applied directly to the back side of the abrasive material, the force or pressure can be applied directly to the support material component 922, and the support material component 922 can desirably transfer or distribute that force or pressure, or a desired portion of the force or pressure, to the back side of the abrasive material, and/or can enable the abrasive material (e.g., sandpaper) to be flexible with regard to its contact with the surfaces of the electrode components (e.g., 904, 906, 908, 910) on the PCB 912. The application of the flexible and/or compressible backing or support material of the support material component 922 to the back side of the abrasive material can enable the abrasive material to desirably contact, and maintain contact, with the surfaces of the electrode components (e.g., 904, 906, 908, 910) on the PCB 912 during the processing of the surfaces of the electrode components. For instance, the flexible and/or compressible support material of the support material component 922 can enable the abrasive material (e.g., sandpaper) to be molded or shaped, or at least somewhat (e.g., partially) molded or shaped (e.g., contoured), to account for (e.g., to conform to) the imperfections of the PCB 912 and maintain desirable contact with the surfaces of the electrode components (e.g., 904, 906, 908, 910) on the PCB 912.

Figure 10:
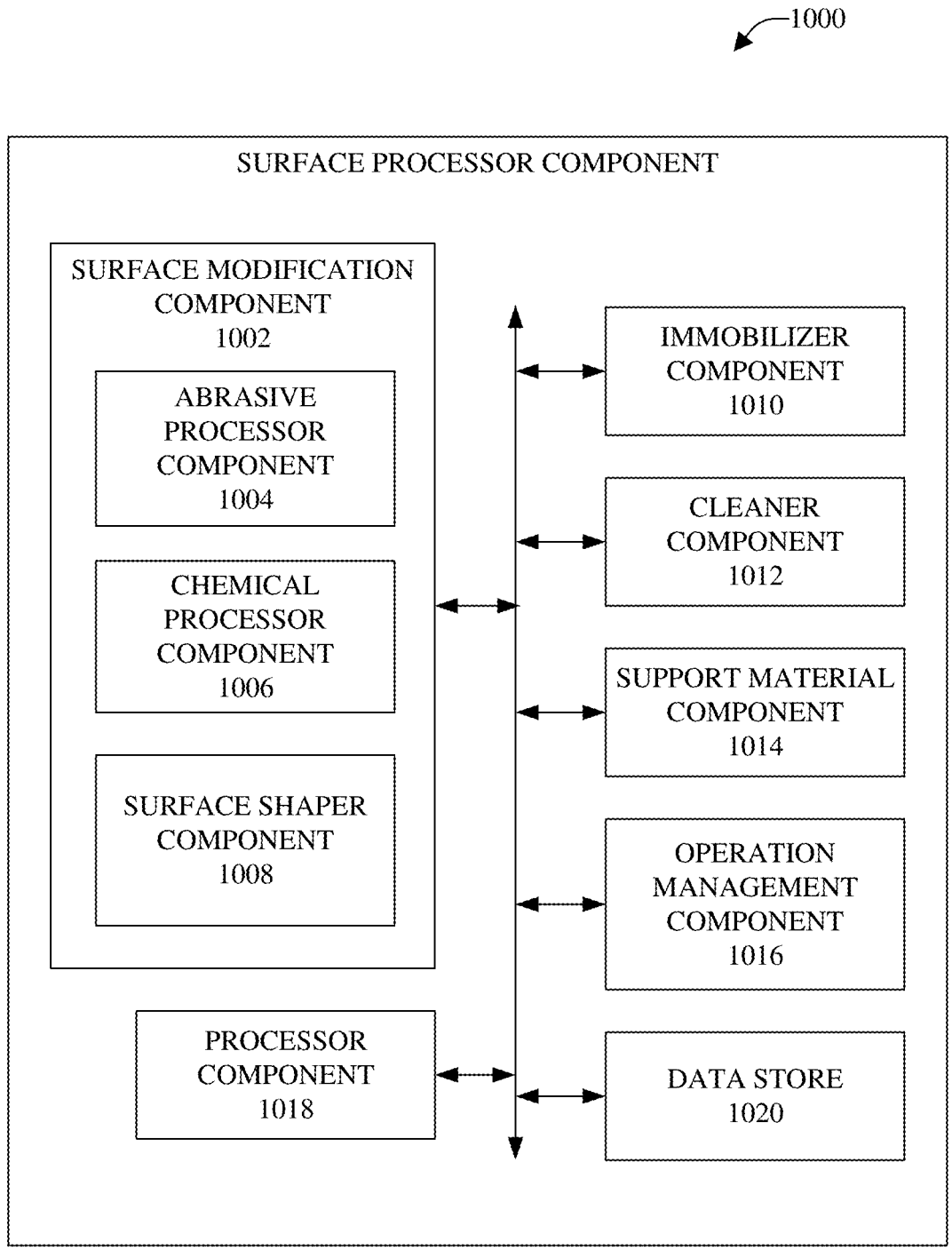
FIG. 10 illustrates a block diagram of an example surface processor component that can process surfaces of electrode components of sensor components to facilitate enhancing operation and performance of sensor components, in accordance with various aspects and embodiments of the disclosed subject matter.

FIG. 10 illustrates a block diagram of an example surface processor component 1000 that can process surfaces of electrode components of sensor components to facilitate enhancing operation and performance of sensor components, in accordance with various aspects and embodiments of the disclosed subject matter. The surface processor component 1000 can comprise a surface modification component 1002, which can include an abrasive processor component 1004, a chemical processor component 1006, and/or a surface shaper component 1008. The surface processor component 1000 also can comprise an immobilizer component 1010, a cleaner component 1012, a support material component 1014, and/or an operation management component 1016.

The abrasive processor component 1004 can be employed to use one or more abrasive materials and abrasive processing techniques to perform one or more abrasive processes on the surfaces (e.g., top surface pads) of electrode components to process and modify the surfaces of the electrode components to reduce the roughness and/or modify the shape of the surfaces of the electrode components, as more fully described herein. The abrasive processor component 1004 can utilize sandpaper of desired grit, diamond or other abrasive pastes, and/or abrasive polishing cloth, for example, on the surfaces of the electrode components to process and modify the surfaces of the electrode components.

The chemical processor component 1006 can utilize one or more chemical materials or solutions, and chemical processing techniques, to perform one or more chemical processes on the surfaces of electrode components to process and modify the surfaces of the electrode components to reduce the roughness and/or modify the shape of the electrode surfaces, as more fully described herein. The chemical processor component 1006 can perform chemical etching and/or chemical polishing on the electrode surfaces to process and modify the surfaces of the electrode components. The chemical etching can comprise, for example, copper or aluminum etching.

The surface shaper component 1008 can operate in conjunction with the abrasive processor component 1004 or chemical processor component 1006 to desirably shape the surfaces of the electrode components, including performing the desired amount of shaping (e.g., desired amount of rounding or doming) of the surfaces of the electrode components. For example, if and when desired, the surface shaper component 1008 can be employed to round all or a portion of the surface of an electrode component such that the surface can be rounded, wherein the edge regions of the electrode surface can be relatively lower in height than the height of the center region of the electrode surface (e.g., when viewing the profile of the electrode surface from the side of the electrode component.

The surface processor component 1000 optionally can include the immobilizer component 1010, which can be utilized to immobilize (e.g., hold stationary) the PCB on which electrode components are formed to facilitate suitable processing (e.g., modifying) of the surfaces of the electrode components. The immobilizer component 1010 can comprise, for example, a vacuum chuck component, an adhesive component, and/or a surface component, as more fully described herein, to facilitate holding the PCB in a stationary position and/or to maintain the PCB in a desirably (e.g., suitably or substantially) flat position to facilitate desirable (e g., enhanced, optimal, or suitable) processing of the surfaces of the electrode components formed on the PCB.

The cleaner component 1012 can be employed to clean or polish the surface of the electrode component, for example, after the electrode surface has been processed (e.g., modified), to remove any debris that may remain on the electrode surface after it has been processed. The cleaner component 1012 can utilize any suitable cleaning solutions to clean or polish the electrode surface.

The support material component 1014 can comprise a flexible and/or compressible support material that can be applied to the back (e.g., non-abrasive side) of an abrasive material, such as sandpaper. The support material component 1014 can comprise, for example, a rubber or other polymer material, a foam material, or other type of flexible and/or compressible material. During processing of the surfaces of the electrode components on a PCB, a desired force or pressure can be applied directly to the support material component 1014, and the support material component 1014 can desirably transfer or distribute that force or pressure, or a desired portion of the force or pressure, to the back side of the abrasive material, and/or can enable the abrasive material (e.g., sandpaper) to be flexible with regard to its contact with the surfaces of the electrode components on the PCB, to facilitate maintaining desirable (e.g., suitable) contact of the abrasive material with the surfaces of the electrode components, as more fully described herein.

The operation management component 1016 can control operations (e.g., performance of operations) of the surface processor component 1000, including the respective operations of the respective components (e.g., the surface modification component 1002, the immobilizer component 1010, the cleaner component 1012, and/or the support material component 1014) of the surface processor component 1000, in accordance with the defined surface processing criteria, as more fully described herein. The operation management component 1016 also can monitor, check, and/or measure (e.g., employing sensors) progress of the processing (e.g., modifying) of the surfaces of electrode components to facilitate determining whether the processing of the electrode surface(s) is suitable (e.g., optimal or acceptable) and/or completed, in accordance with the defined surface processing criteria. For example, the operation management component 1016 can sense or measure (e.g., using a sensor(s)) the roughness and/or shape of the electrode surface of an electrode component before, during, and/or after processing (e.g., initial processing or modifying) of the electrode surface to determine the progress of the processing of the electrode surface, determine the level of roughness of the electrode surface, determine the level of roundness of the electrode surface, and/or determine whether the electrode surface has been processed (e.g., modified) to satisfy the defined surface processing criteria (e.g., determine whether the electrode surface has been desirably (e.g., suitably, optimally, or acceptably) processed or modified, in accordance with the defined surface processing criteria).

The surface processor component 1000 also can include a processor component 1018 and data store 1020. The processor component 1018 can work in conjunction with the other components (e.g., the surface modification component 1002, the immobilizer component 1010, the cleaner component 1012, the support material component 1014, the operation management component 1016, and/or the data store 1020) to facilitate performing the various functions of the surface processor component 1000. The processor component 1018 can employ one or more processors, microprocessors, or controllers that can process data, such as information relating to processing (e.g., modifying) electrode surfaces, parameters, policies, defined surface processing criteria, algorithms (e.g., defined surfacing processing algorithm(s)), protocols, interfaces, tools, and/or other information, to facilitate operation of the surface processor component 1000, as more fully disclosed herein, and control data flow between the surface processor component 1000 and other components (e.g., communication device, device of the communication network, data sources, applications) associated with the surface processor component 1000.

The data store 1020 can store data structures (e.g., user data, metadata), code structure(s) (e.g., modules, objects, hashes, classes, procedures) or instructions, information relating to processing (e.g., modifying) electrode surfaces, parameters, policies, defined surface processing criteria, algorithms (e.g., defined surface processing algorithm(s)), protocols, interfaces, tools, and/or other information, to facilitate controlling operations associated with the surface processor component 1000. In an aspect, the processor component 1018 can be functionally coupled (e.g., through a memory bus) to the data store 1020 in order to store and retrieve information desired to operate and/or confer functionality, at least in part, to the surface modification component 1002, the immobilizer component 1010, the cleaner component 1012, the support material component 1014, the operation management component 1016, and/or the data store 1020, etc., and/or substantially any other operational aspects of the surface processor component 1000.

Figure 11:
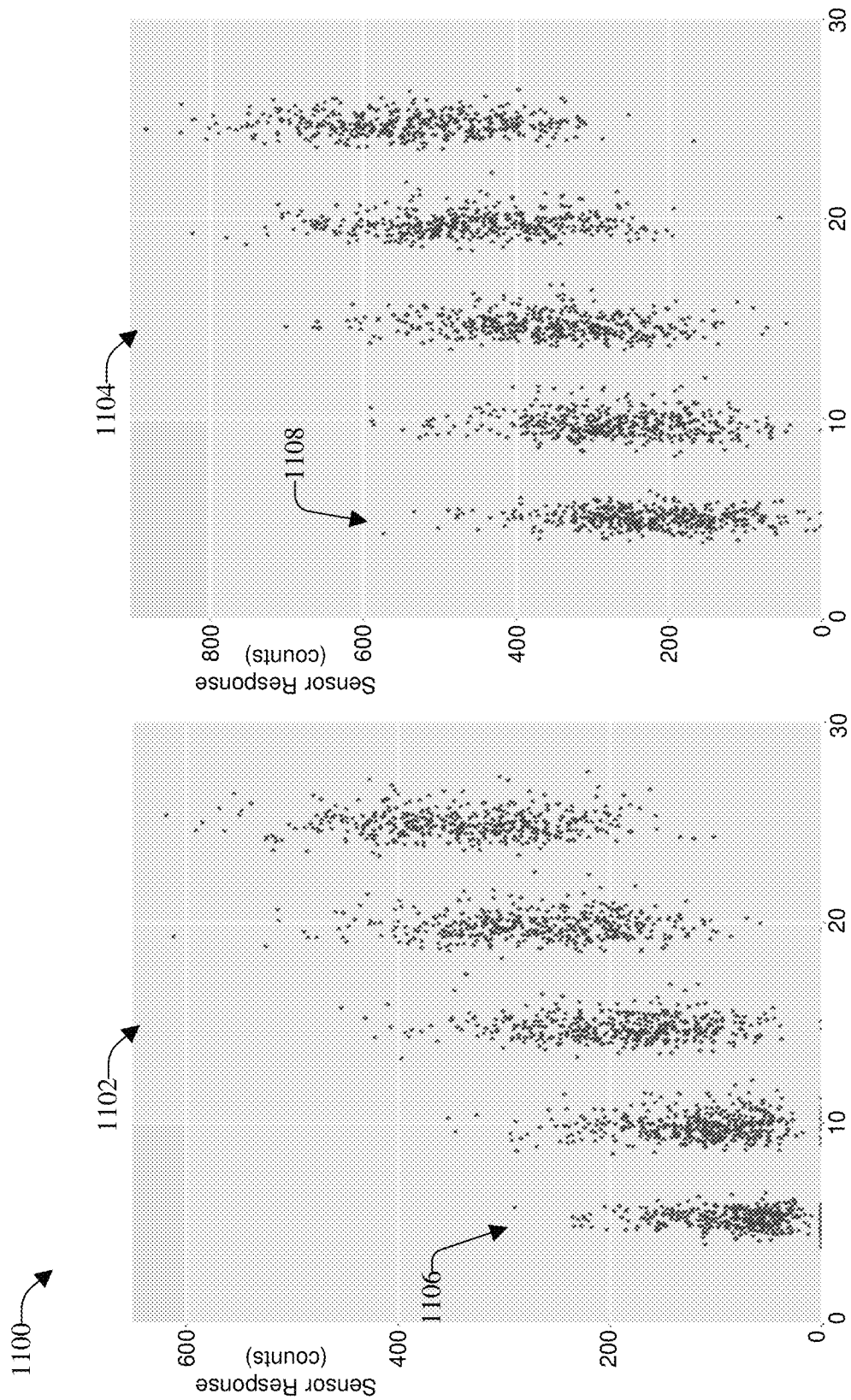
FIG. 11 presents diagrams of example graphs that can illustrate enhancement of performance of sensors with electrodes with surfaces processed (e.g., sanded) as described herein as compared to unprocessed electrode surfaces, in accordance with various aspects and embodiments of the disclosed subject matter.

FIG. 11 presents diagrams of example graphs 1100 that can illustrate enhancement of performance of sensors with electrodes with surfaces processed (e.g., sanded) as described herein as compared to unprocessed electrode surfaces, in accordance with various aspects and embodiments of the disclosed subject matter. The example graphs 1100 can comprise graph 1102 that can depict sensor responses, as measured in counts (e.g., number of sensor responses), of a sensor, comprising an unprocessed electrode, as a function of probe force, as measured in grams. The example graphs 1100 also can comprise graph 1104 that can depict sensor responses, as measured in counts, of a sensor, comprising a processed electrode (e.g., electrode with a processed or modified (e.g., sanded) surface), as a function of probe force, as measured in grams. The counts can be the number of counts from an analog-to-digital converter (ADC). An ADC can convert an analog signal (e.g., which can be measured in volts) to a digital signal (e.g., which can be measured in counts). Therefore, the number of "counts" can represent the magnitude of the sensor response for any given sensing event.

As can readily be observed from the graph 1102 and the graph 1104, the sensor response (as depicted in graph 1104) of the sensor that has been enhanced by processing the surface of the electrode of the sensor is significantly better than the sensor response (as depicted in graph 1102) of the sensor that contains the electrode with the unprocessed surface. For instance, the respective sensor responses (e.g., mean sensor response) at respective probe force levels for the sensor comprising the processed electrode can be significantly higher (e.g., significantly improved) than the sensor responses at respective probe force levels of the sensor containing the unprocessed electrode. Also, the sensor having the processed (e.g., sanded) electrode can have relatively fewer zero-response points than the sensor having the unprocessed electrode. For example, at a 5 gram (g) probe force, the sensor having the processed electrode can have a higher mean response and fewer zero-response points than the sensor having the unprocessed electrode, as illustrated at reference numerals 1106 and 1108, respectively. As can be observed from the graphs 1102 and 1104, the sensitivity of a sensor comprising a processed (e.g., sanded) electrode can be significantly improved over a sensor having an unprocessed electrode.

Figure 12:
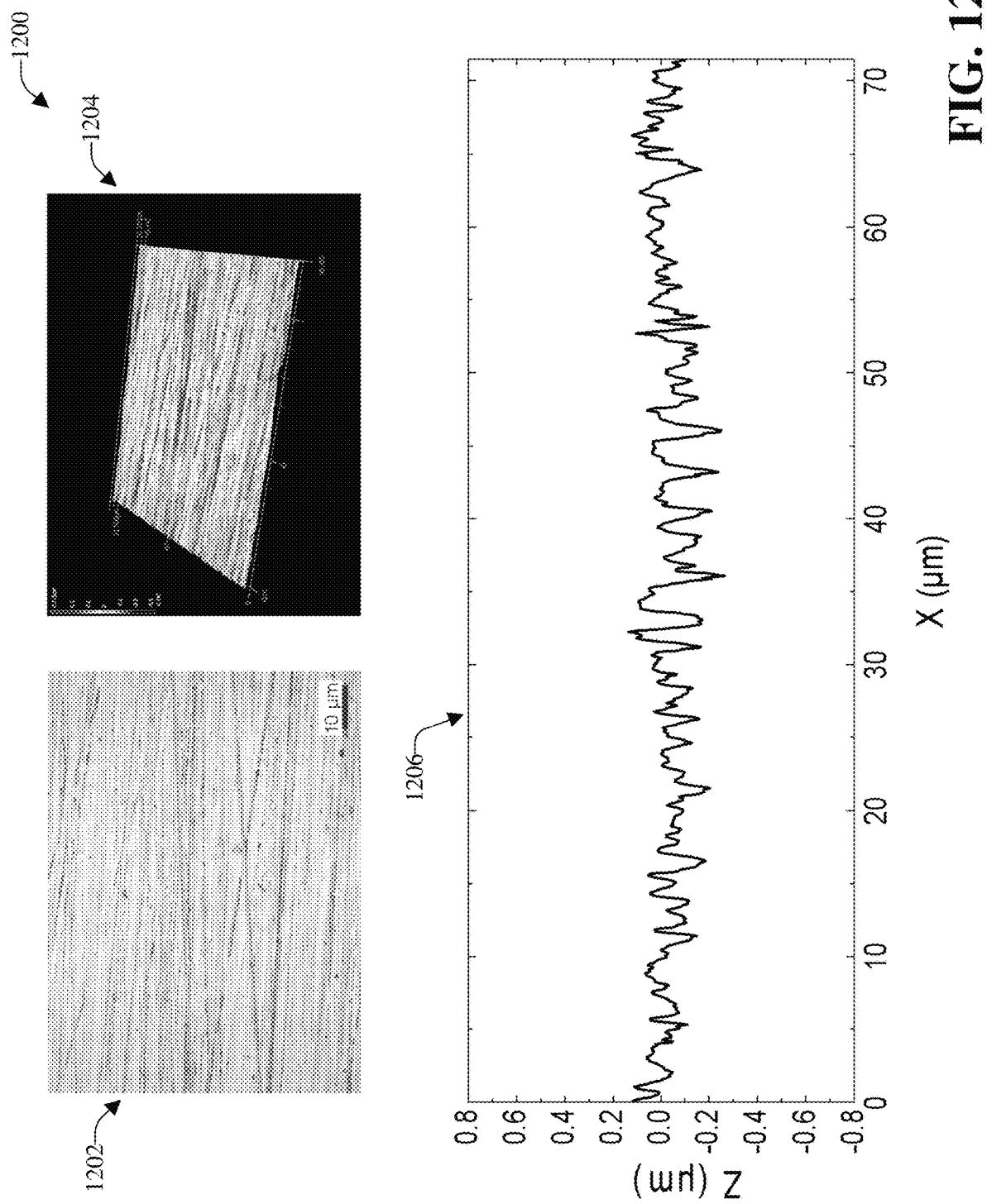
FIGS. 12 and 13 depict respective diagrams of respective electrode-surface information that can illustrate enhancement of a processed (e.g., sanded) electrode surface to facilitate reducing the amount of roughness of such electrode surface, using the disclosed techniques, as compared to an unprocessed electrode surface, in accordance with various aspects and embodiments of the disclosed subject matter.
Figure 13:
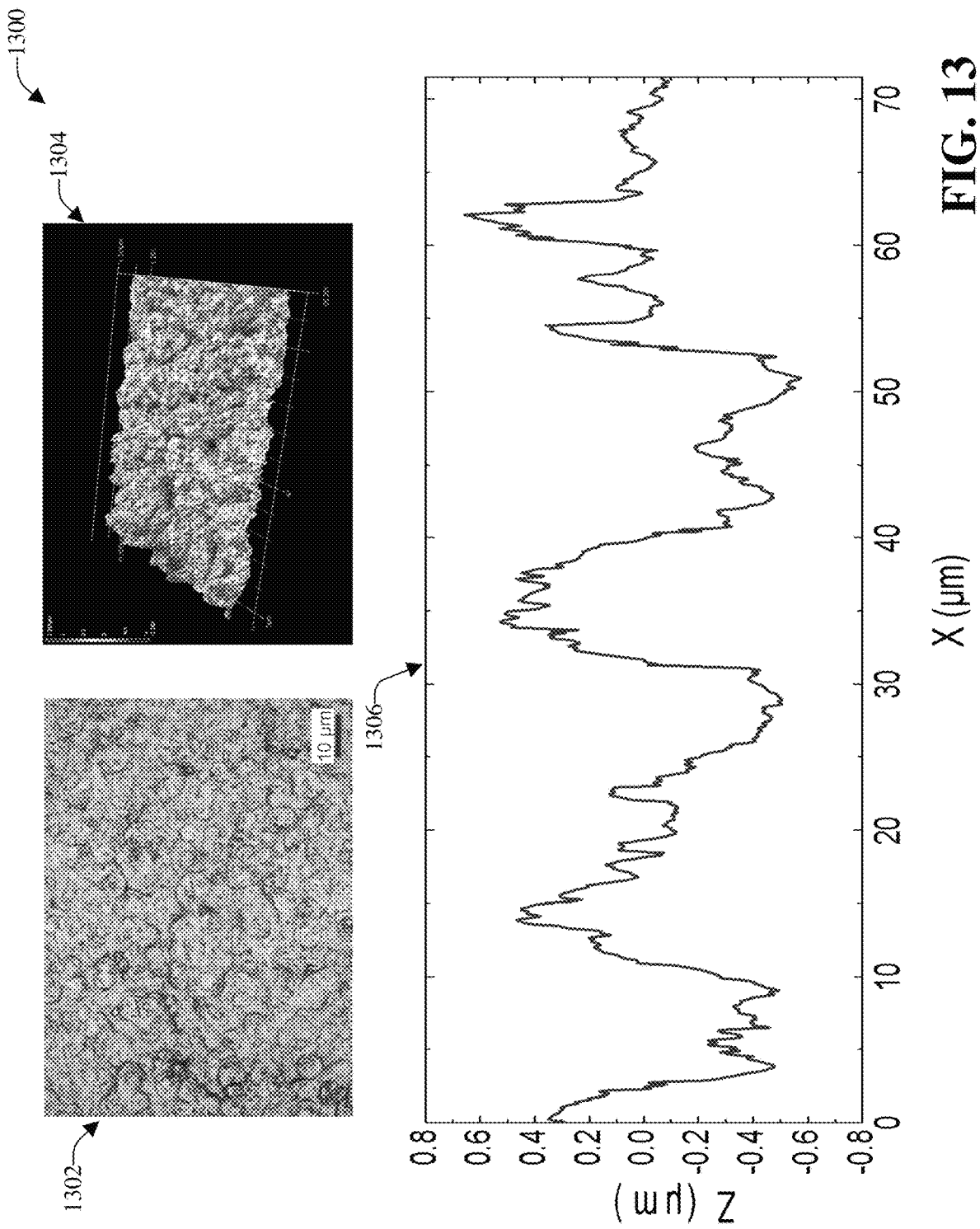

Turning to FIGS. 12 and 13, FIGS. 12 and 13 depict respective diagrams of respective electrode-surface information 1200 and 1300 that can illustrate enhancement of a processed (e.g., sanded) electrode surface to facilitate reducing the amount of roughness of such electrode surface, using the disclosed techniques, as compared to an unprocessed electrode surface, in accordance with various aspects and embodiments of the disclosed subject matter. The electrode-surface information 1200 can relate to a processed (e.g., sanded) electrode that can be utilized in a sensor. This example electrode-surface information 1200 can relate to an electrode that has had its surface sanded using sandpaper having 2000 grit to facilitate reducing an amount of roughness of the electrode surface. The electrode-surface information 1200 can comprise a micrograph 1202 of the surface of a processed (e.g., sanded) electrode (e.g., at a 10 µm level), a 3-D image 1204 of the processed electrode surface (e.g., with the z-axis scaled by 5 times (5×)), and a graph 1206 of a line profile of the processed electrode surface that can illustrate the profile of the processed electrode surface in µm with respect to the z-axis and x-axis (e.g., to illustrate the relative smoothness (e.g., the reduction in roughness) of the processed electrode surface, as compared to the unprocessed electrode surface). The profile can be perpendicular to the sanding direction.

The electrode-surface information 1300 of FIG. 13 can include a micrograph 1302 of the surface of an unprocessed electrode (e.g., at a 10 µl level), a 3-D image 1304 of the unprocessed electrode surface (e.g., with the z-axis scaled by 5×), and a graph 1306 of a line profile of the unprocessed electrode surface that can illustrate the profile of the unprocessed electrode surface in µm with respect to the z-axis and x-axis. As can readily be observed by comparing micrograph 1202 to micrograph 1302, 3-D image 1204 to 3-D image 1304, and graph 1206 to graph 1306, the processed surface of the processed electrode (e.g., associated with the electrode-surface information 1200) is relatively and significantly smoother (e.g., enhanced, less rough), as compared to the unprocessed surface of the unprocessed electrode (e.g., associated with the electrode-surface information 1300).

For example, $S_{xp}$ (e.g., $S_{xp\ (p=2.5\%)}$) is the extreme peak height, which measures the height of the highest protrusions on the electrode surface while remaining relatively robust against spurious peaks on the surface, and $S_q$ is the root-mean-square surface roughness of the electrode surface (e.g., essentially the standard deviation of the surface height of the electrode surface). As can be observed from graph 1206 and graph 1306, the extreme peak height, $S_{xp\ (p=2.5\%)}$, for the processed electrode surface is significantly lower (e.g., at 12 µm) than the extreme peak height of the unprocessed electrode surface (e.g., at 70 µm). Also, the root-mean-square surface roughness, $S_q$, of the processed electrode surface (e.g., at 0.07 µm) is significantly lower than the root-mean-square surface roughness of the unprocessed electrode surface (e.g., at 0.32 µm). Thus, it is clear that the processed electrode surface is smoother (e.g., less rough), has reduced peak heights, and has reduced deviation between higher points and lower points on the surface than the unprocessed electrode surface. As a result, in a sensor, the processed electrode can provide improved sensitivity, accuracy, reliability, and overall performance than the unprocessed electrode.

Figure 14:
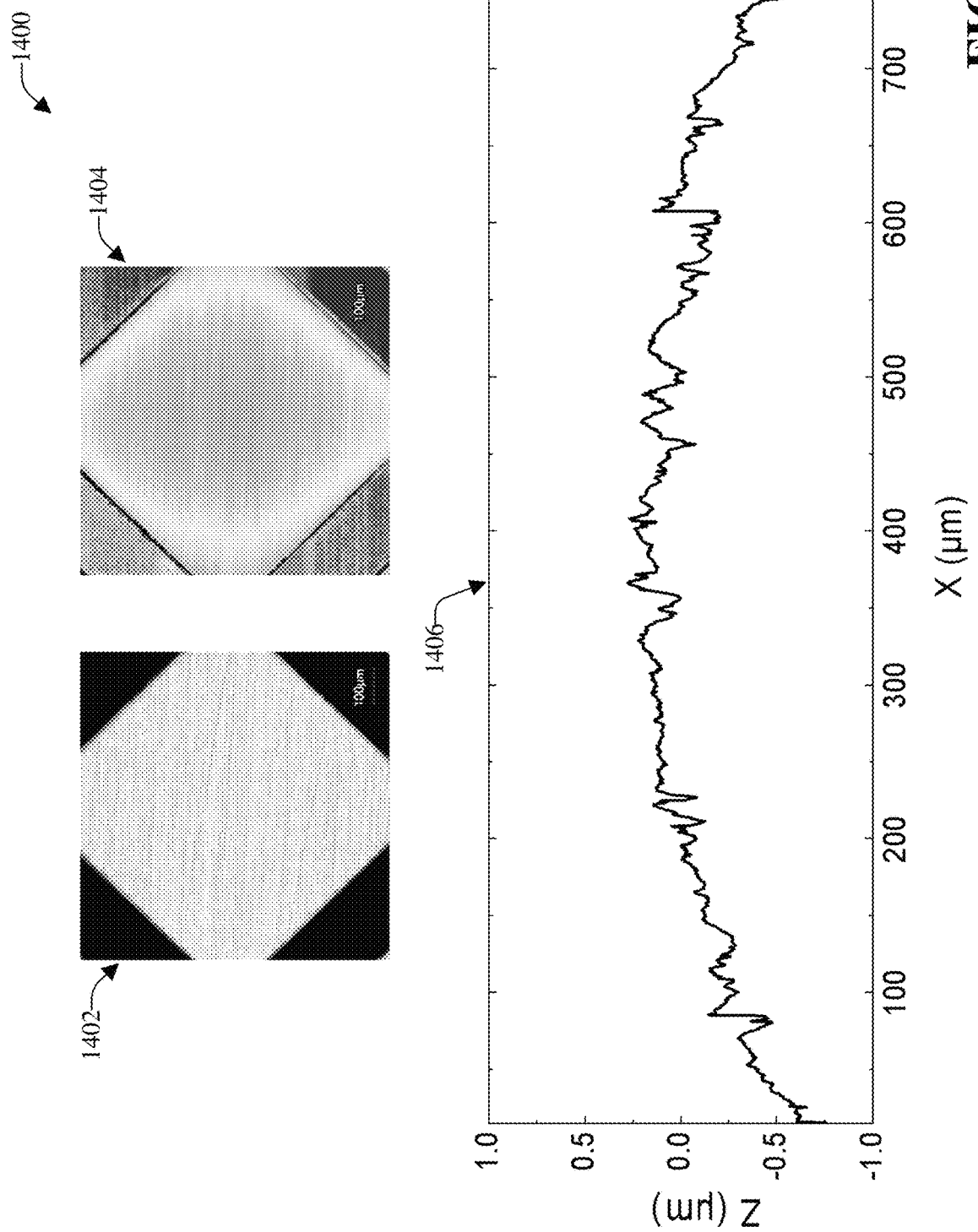

Referring to FIGS. 14 and 15, FIGS. 14 and 15 present respective diagrams of respective electrode-surface information 1400 and 1500 that can illustrate enhancement of a processed (e.g., sanded and rounded) electrode surface that has been modified to be rounded, using the disclosed techniques, as compared to an unprocessed electrode surface, in accordance with various aspects and embodiments of the disclosed subject matter. The electrode-surface information 1400 can relate to a processed (e.g., sanded and rounded) electrode that can be utilized in a sensor. This example electrode-surface information 1400 can relate to an electrode that has had its surface sanded using sandpaper having 2000 grit to facilitate rounding the surface of the electrode and reducing an amount of roughness of the electrode surface. The electrode-surface information 1400 can comprise a micrograph 1402 of the surface of a processed (e.g., sanded and rounded) electrode (e.g., at a 100 µm level), a height map 1404 of the processed electrode surface (e.g., at a 100 µm level), and a graph 1406 of a line profile of the processed electrode surface that can illustrate the profile of the processed electrode surface in µm with respect to the z-axis and x-axis (e.g., to illustrate the relative rounding and the relative smoothness (e.g., the reduction in roughness) of the processed electrode surface, as compared to the unprocessed electrode surface). The profile can be perpendicular to the sanding direction.

The electrode-surface information 1500 of FIG. 15 can include a micrograph 1502 of the surface of an unprocessed electrode (e.g., at a 100 μm level), a height map 1504 of the unprocessed electrode surface (e.g., at a 100 μm level), and a graph 1506 of a line profile of the unprocessed electrode surface that can illustrate the profile of the unprocessed electrode surface in μm with respect to the z-axis and x-axis. As can readily be observed by comparing micrograph 1402 to micrograph 1502, the height map 1404 to the height map 1504, and the graph 1406 to the graph 1506, the processed surface of the processed electrode (e.g., associated with the electrode-surface information 1400) is relatively and significantly more rounded and smoother (e.g., enhanced, rounded, and less rough), as compared to the unprocessed surface of the unprocessed electrode (e.g., associated with the electrode-surface information 1500).

For example, the height map 1404 for the processed electrode surface shows more consistent height levels on the electrode surface than the height levels presented in the height map 1504 for the unprocessed electrode, and thus, there is reduced roughness on the processed electrode surface as compared to the unprocessed electrode surface. Further, in the height map 1404, it can be seen that there are height differences near the edges of the electrode surface, as compared to the center portion of the electrode surface, due to the rounding of the electrode surface. As another example, in the graph 1406, the rounding of the electrode surface can be observed from the relative height data in the line profile, as the height of the processed electrode surface generally and noticeably decreases when proceeding from the center portion of the electrode surface to the edges of the electrode surface. Further, the graph data (e.g., height data) of graph 1406, as compared to the graph data of graph 1506, illustrates the reduction in roughness of the processed electrode surface as compared to the unprocessed electrode surface, as there is reduced deviation in heights between adjacent surface points on the processed electrode surface (e.g., when discounting the desired rounding of the electrode surface), as compared to the deviation in heights between adjacent surface points on the unprocessed electrode surface.

Turning briefly to FIGS. 16 and 17, FIGS. 16 and 17 depict respective diagrams of respective electrode-surface information 1600 and 1700 that can illustrate enhancement of processed (e.g., sanded and rounded) electrode surfaces, using the disclosed techniques, as compared to an unprocessed electrode surface, in accordance with various aspects and embodiments of the disclosed subject matter. The electrode-surface information 1600 can relate to processed (e.g., sanded) electrodes that can be utilized in sensors. This example electrode-surface information 1600 can relate to electrodes that have had their surfaces sanded using sandpaper having 2000 grit to facilitate rounding the surfaces of the electrodes and reducing the amount of roughness of the electrode surfaces. The electrode-surface information 1600 can comprise a micrograph 1602 of the surfaces of processed (e.g., sanded) electrodes, a height map 1604 of processed electrode surfaces, and a graph 1606 of a line profile of the processed electrode surfaces that can illustrate the profile of the processed electrode surfaces in μm with respect to the z-axis and x-axis (e.g., to illustrate the relative rounding and the relative smoothness (e.g., the reduction in roughness) of the processed electrode surfaces, as compared to the unprocessed electrode surfaces). The profile can be perpendicular to the sanding direction.

The electrode-surface information 1700 of FIG. 17 can include a micrograph 1502 of the surfaces of an unprocessed electrodes, a height map 1704 of the unprocessed electrode surfaces, and a graph 1706 of a line profile of the unprocessed electrode surfaces that can illustrate the profile of the unprocessed electrode surfaces in μm with respect to the z-axis and x-axis. Similar to the results observed with regard to the electrode-surface information 1400 of FIG. 14 and the electrode-surface information 1500 of FIG. 15, with regard to FIGS. 16 and 17, as can readily be observed by comparing micrograph 1602 to micrograph 1702, the height map 1604 to the height map 1704, and the graph 1606 to the graph 1706, the processed surfaces of the processed electrodes (e.g., associated with the electrode-surface information 1600) are relatively and significantly more rounded and smoother (e.g., enhanced, rounded, and less rough), as compared to the unprocessed surfaces of the unprocessed electrodes (e.g., associated with the electrode-surface information 1700).

Figure 18:
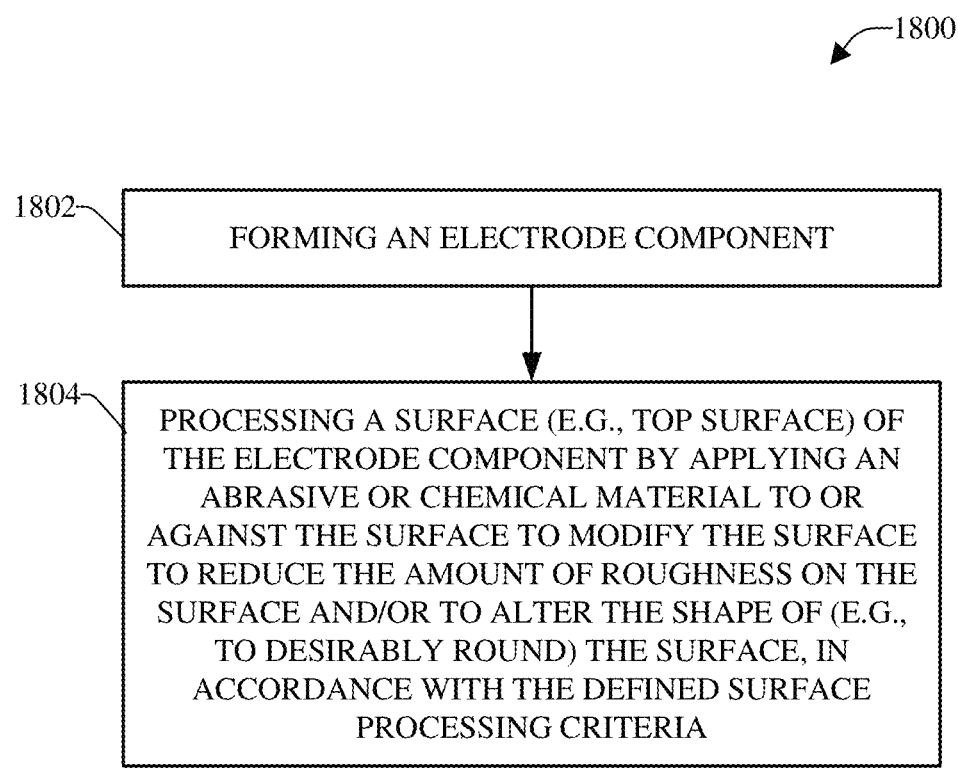
FIG. 18 illustrates an example, non-limiting method for processing (e.g., modifying) a surface of an electrode component of a sensor component, in accordance with various aspects and embodiments of the disclosed subject matter.
Figure 19:
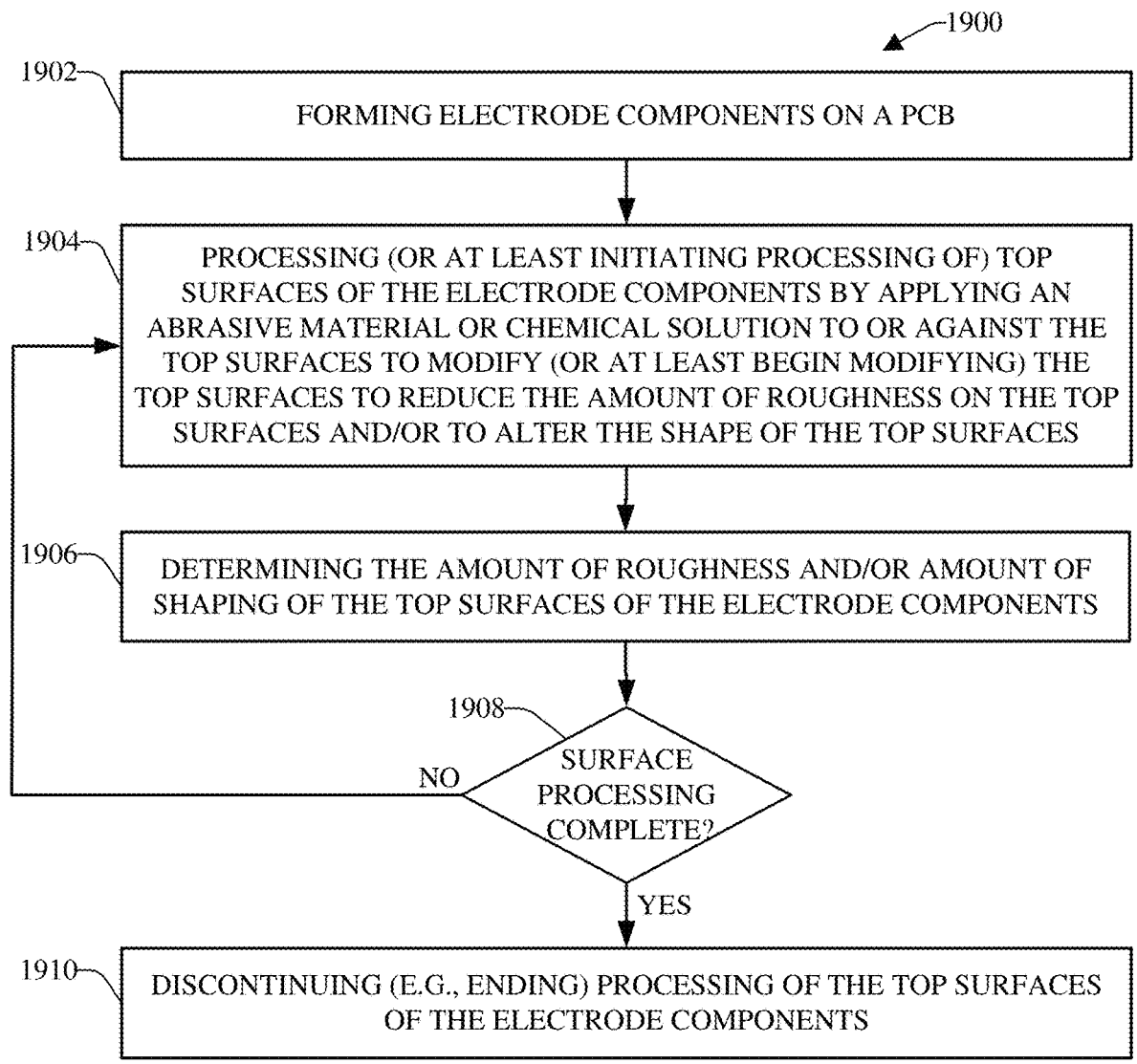
FIG. 19 presents another example, non-limiting method for processing (e.g., modifying) a surface of an electrode component of a sensor component, in accordance with various aspects and embodiments of the disclosed subject matter.
Figure 20:
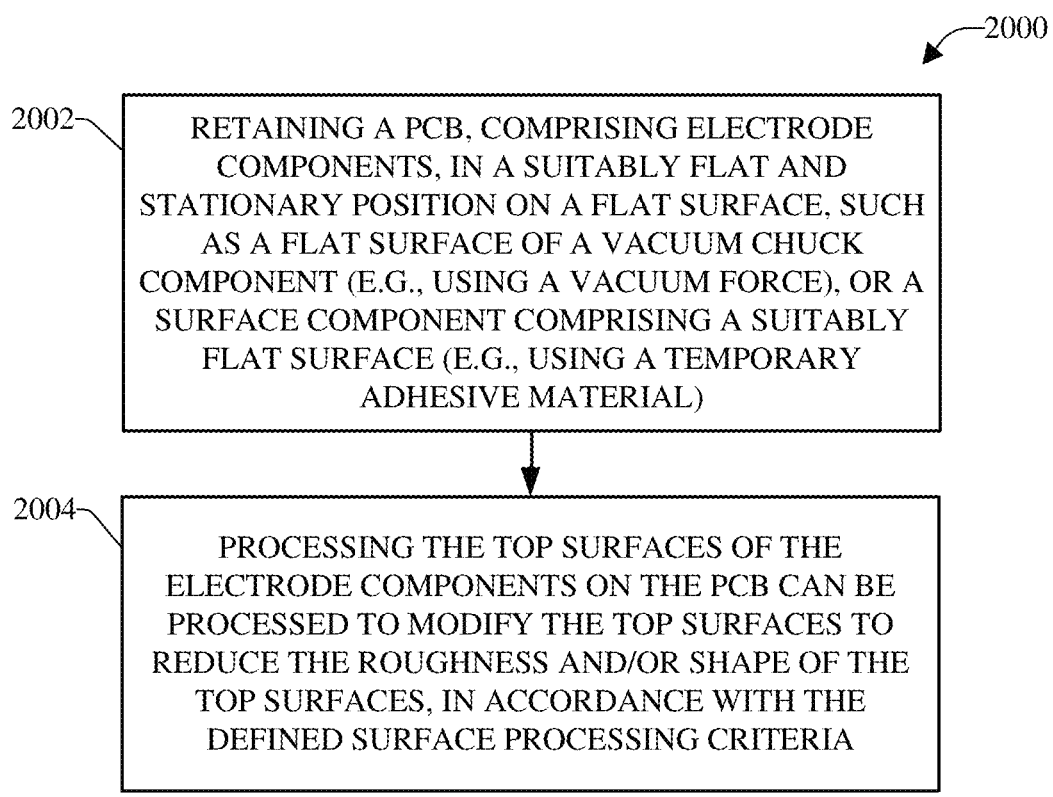
FIG. 20 depicts an example, non-limiting method for retaining a PCB in in a desired stationary and flat position to facilitate processing (e.g., modifying) a surface of an electrode component of a sensor component, in accordance with various aspects and embodiments of the disclosed subject matter.

In view of the example systems and/or devices described herein, example methods that can be implemented in accordance with the disclosed subject matter can be further appreciated with reference to flowcharts in FIGS. 18-20. For purposes of simplicity of explanation, example methods disclosed herein are presented and described as a series of acts; however, it is to be understood and appreciated that the disclosed subject matter is not limited by the order of acts, as some acts may occur in different orders and/or concurrently with other acts from that shown and described herein. For example, a method disclosed herein could alternatively be represented as a series of interrelated states or events, such as in a state diagram. Moreover, interaction diagram(s) may represent methods in accordance with the disclosed subject matter when disparate entities enact disparate portions of the methods. Furthermore, not all illustrated acts may be required to implement a method in accordance with the subject specification. It should be further appreciated that the methods disclosed throughout the subject specification are capable of being stored on an article of manufacture to facilitate transporting and transferring such methods to computers for execution by a processor or for storage in a memory.

FIG. 18 illustrates an example, non-limiting method 1800 for processing (e.g., modifying) a surface of an electrode component of a sensor component, in accordance with various aspects and embodiments of the disclosed subject matter. The method 1800 can be implemented by a surface processor component and/or a processor component.

At 1802, an electrode component can be formed. The processor component or surface processor component can form or facilitate forming the electrode component. The electrode component can be employed to be part of a sensor component. In some embodiments, the electrode component can be part of a set of electrode components formed on a PCB in connection with creating a set of sensor components.

At 1804, a surface (e.g., top surface) of the electrode component can be processed by applying an abrasive or chemical material to or against the surface to modify the surface to reduce the amount of roughness on the surface and/or to alter the shape of (e.g., to desirably round) the surface, in accordance with the defined surface processing criteria. The surface processor component can process the surface of the electrode components by applying an abrasive material or chemical solution to or against the surface to modify the surface to reduce the amount of roughness on the surface and/or to alter the shape (e.g., to desirably round) the surface, as more fully described herein.

FIG. 19 presents another example, non-limiting method 1900 for processing (e.g., modifying) a surface of an electrode component of a sensor component, in accordance with various aspects and embodiments of the disclosed subject matter. The method 1900 can be implemented by a surface processor component and/or a processor component.

At 1902, forming electrode components (e.g., electrodes) on a PCB. The processor component or surface processor component can form or facilitate forming electrode components on a PCB. For example, a substrate can comprise a layer copper or other conductive material, and the processor component can form or facilitate forming the electrode components by etching away or otherwise removing portions (e g., channels or trenches) of the copper or conductive material to form a set of electrode components in a desired electrode pattern and/or other electronic components or connections, wherein channels or trenches formed by the removal of the conductive material can be non-conductive areas.

In some embodiments, holes can be drilled in the electrode components (e.g., in the top surface pads of the electrode components) to facilitate electrically connecting other electronic components to the electrode components. In certain embodiments, the surface of the PCB can be planarized, for example, to remove debris (e.g., burrs) that can or may be formed on the PCB due to the drilling of the holes. The processor also can perform or facilitate performing electroplating to electroplate or deposit a thin layer of conductive material (e.g., copper) on the electrode components to facilitate forming different electrical connections throughout different layers of the PCB, as desired. The top surfaces of the electrode components are generally flat before the electroplating and are generally flat after the electroplating.

At 1904, the top surfaces of the electrode components can be processed (or at least processing can be initiated) by applying an abrasive material or chemical solution to or against the top surfaces to modify (or at least begin modifying) the top surfaces to reduce the amount of roughness on the top surfaces and/or to alter the shape of (e.g., to desirably round) the top surfaces, in accordance with the defined surface processing criteria. The surface processor component can process (or at least can begin processing) the top surfaces of the electrode components by applying an abrasive or chemical material to or against the top surfaces to modify (or at least begin modifying) the top surfaces to reduce the amount of roughness on the top surfaces and/or to alter the shape of the top surfaces, as more fully described herein.

At 1906, the amount of roughness and/or amount of shaping of the top surfaces of the electrode components can be determined. The surface processor component can monitor, check, analyze, measure, and/or determine the amount of roughness and/or the amount of shaping of the top surfaces of the electrode components to facilitate determining whether the amount of roughness and/or the amount of shaping of the top surfaces of the electrode components is suitable (e.g., optimal or acceptable), in accordance with the defined surface processing criteria.

At 1908, a determination can be made regarding whether the processing of the top surfaces of the electrode components is complete. The surface processor component can check, analyze, and/or measure the amount of roughness and/or the amount of shaping of the top surfaces of the electrode components to facilitate determining whether the processing of the top surfaces of the electrode components is complete (e.g., determining whether the amount of roughness and/or the amount of shaping of the top surfaces of the electrode components is suitable (e.g., satisfies the defined surface processing criteria), in accordance with the defined surface processing criteria).

If it is determined that the processing of the top surfaces of the electrode components is complete, at 1910, processing of the top surfaces of the electrode components can discontinue (e.g., end). If the surface processor component determines that the amount of roughness and/or the amount of shaping of the top surfaces of the electrode components is suitable, in accordance with the defined surface processing criteria, the surface processor component can determine that the processing of the top surfaces of the electrode components is complete, and can end (e.g., terminate, cease) processing of the top surfaces.

If, at 1908, it is determined that the processing of the top surfaces of the electrode components is not complete, the method 1900 can return to reference numeral 1904, wherein further processing of the top surfaces of the electrode components can be performed, and the method 1900 can proceed from that point, for example, until it is determined that the amount of roughness and/or the amount of shaping of the top surfaces of the electrode components is suitable, in accordance with the defined surface processing criteria.

FIG. 20 depicts an example, non-limiting method 2000 for retaining a PCB (e.g., a flexible or uneven PCB) in in a desired stationary and flat position to facilitate processing (e.g., modifying) a surface of an electrode component of a sensor component, in accordance with various aspects and embodiments of the disclosed subject matter. The method 2000 can be implemented by a surface processor component, a processor component, an immobilizer component, a vacuum chuck component, an adhesive component, and/or a surface component.

At 2002, a PCB, comprising electrode components, can be retained in a suitably flat and stationary position on a flat surface, such as the flat surface of a vacuum chuck component (e.g., using a vacuum force), or a surface component comprising a suitably flat surface (e.g., using a temporary adhesive material). Some PCBs can be a flexible, which can cause the flexible PCB to undesirably move or deflect in response to processing of the top surfaces of the electrode components. Also, other PCBs, even if not readily flexible, can be somewhat uneven and/or can have certain imperfections, such as a certain amount of bowing of the PCB, and/or ripples or ridges on the surface of the PCB, which can cause the PCB to not be suitably or completely flat when laid on another surface to process the top surfaces of the electrode components. Such issues with regard to a flexible PCB board or a PCB with certain imperfections potentially can negatively impact processing of the top surfaces of the electrode components.

In accordance with various embodiments, the surface processor component or another component can employ a vacuum chuck component, or alternatively, an adhesive component and surface component, to retain the PCB in a suitably flat and stationary position on the flat surface of the vacuum chuck component or surface component. For instance, in some embodiments, the vacuum chuck component can apply a vacuum of suitable pressure to hold the PCB is a suitably flat and stationary position on the flat surface of the vacuum chuck component, as more fully described herein. In other embodiments, the adhesive component can apply an adhesive material (e.g., a temporary adhesive material) to the bottom surface of the PCB and/or the flat surface of the surface component, the PCB can be placed on the flat surface, and the adhesive material can hold the PCB in a suitably flat and stationary position on the flat surface of the surface component. In still other embodiments, with regard to PCBs that can or may have certain imperfections, a support material component, comprising flexible and/or compressible material, can be applied to the back side of abrasive material, such as sandpaper, to facilitate maintaining desirable contact with the electrode surfaces during processing of the electrode components, as more fully described herein.

At 2004, the top surfaces of the electrode components on the PCB can be processed to modify the top surfaces to reduce the roughness and/or shape of the top surfaces, in accordance with the defined surface processing criteria. With the PCB retained in a suitably flat and stationary position on the flat surface, the surface processor component can process the top surfaces of the electrode components on the PCB to modify the top surfaces to reduce the roughness and/or shape of the top surfaces, in accordance with (e.g., to comply with or satisfy) the defined surface processing criteria, as more fully described herein.

Figure 21:
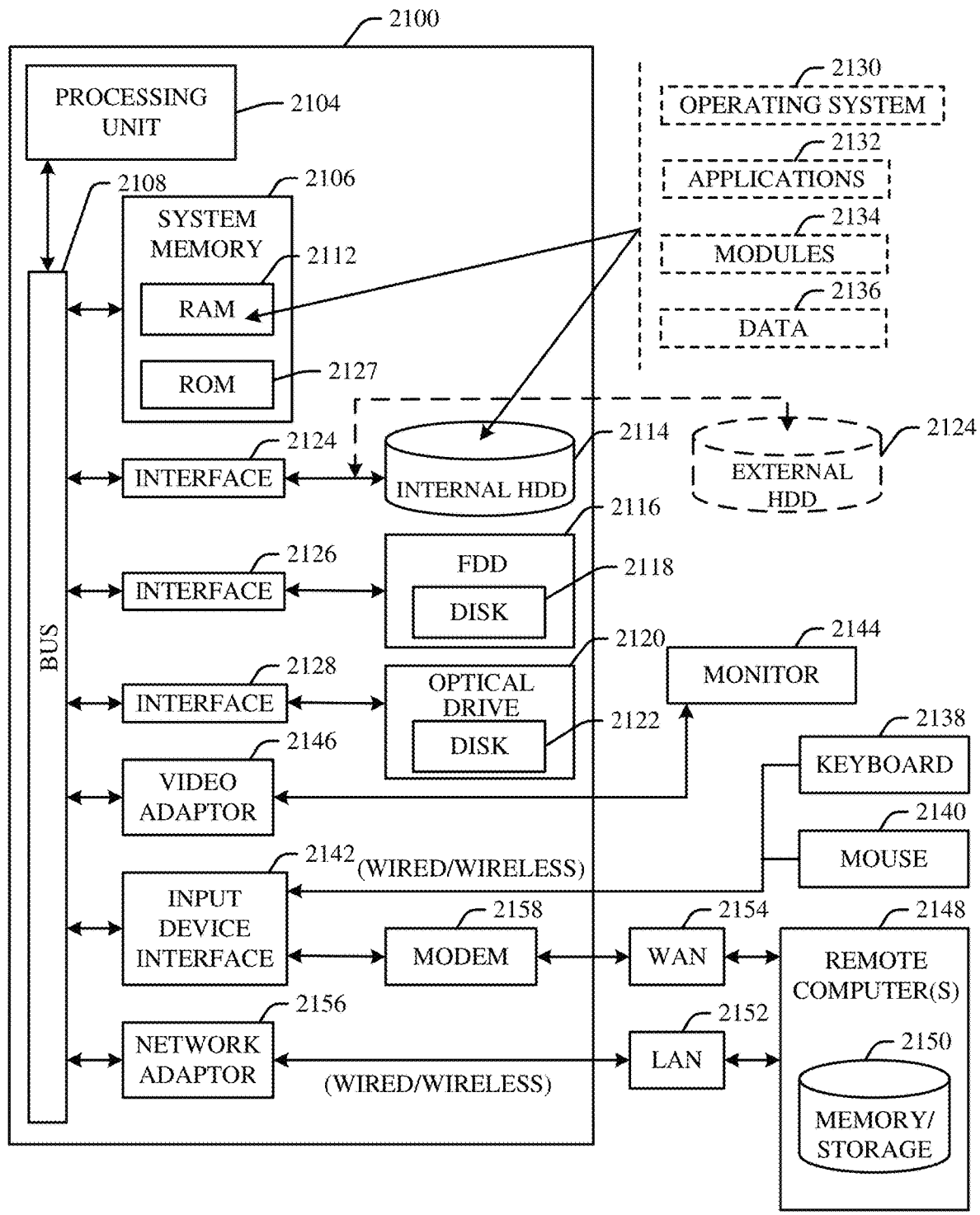
FIG. 21 illustrates an example block diagram of an example computer operable to engage in a system architecture that facilitates processing of electrode surfaces according to one or more embodiments described herein.

Referring now to FIG. 21, illustrated is an example block diagram of an example computer 2100 operable to engage in a system architecture that facilitates processing surfaces of electrode components to modify the surfaces of the electrode components, and/or to manufacture sensor components comprising electrode components (and other components), according to one or more embodiments described herein. The computer 2100 can provide networking and communication capabilities between a wired or wireless communication network and a server (e.g., Microsoft server) and/or communication device. In order to provide additional context for various aspects thereof, FIG. 21 and the following discussion are intended to provide a brief, general description of a suitable computing environment in which the various aspects of the disclosed subject matter can be implemented to facilitate the processing of surfaces of electrode components to modify the surfaces of the electrode components, and/or to manufacture sensor components. While the description above is in the general context of computer-executable instructions that can run on one or more computers, those skilled in the art will recognize that the disclosed subject matter also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the disclosed methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices.

The illustrated aspects of the disclosed subject matter can also be practiced in distributed computing environments where certain tasks are performed by remote processing devices that can be linked through a communications network. In a distributed computing environment, program modules can be located in both local and remote memory storage devices.

Computing devices typically include a variety of media, which can include computer-readable storage media or communications media, which two terms are used herein differently from one another as follows.

Computer-readable storage media can be any available storage media that can be accessed by the computer and includes both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

Communications media can embody computer-readable instructions, data structures, program modules, or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference to FIG. 21, implementing various aspects described herein with regards to the end-user device can include a computer 2100, the computer 2100 including a processing unit 2104, a system memory 2106 and a system bus 2108. The system bus 2108 couples system components including, but not limited to, the system memory 2106 to the processing unit 2104. The processing unit 2104 can be any of various commercially available processors. Dual microprocessors and other multi processor architectures can also be employed as the processing unit 2104.

The system bus 2108 can be any of several types of bus structure that can further interconnect to a memory bus (with or without a memory controller), a peripheral bus, and a local bus using any of a variety of commercially available bus architectures. The system memory 2106 includes read-only memory (ROM) 2127 and random access memory (RAM) 2112. A basic input/output system (BIOS) is stored in a non-volatile memory 2127 such as ROM, EPROM, EEPROM, which BIOS contains the basic routines that help to transfer information between elements within the computer 2100, such as during start-up. The RAM 2112 can also include a high-speed RAM such as static RAM for caching data.

The computer 2100 further includes an internal hard disk drive (HDD) 2114 (e.g., EIDE, SATA), which internal hard disk drive 2114 can also be configured for external use in a suitable chassis (not shown), a magnetic floppy disk drive (FDD) 2116, (e.g., to read from or write to a removable diskette 2118) and an optical disk drive 2120, (e.g., reading a CD-ROM disk 2122 or, to read from or write to other high capacity optical media such as the DVD). The hard disk drive 2114, magnetic disk drive 2116 and optical disk drive 2120 can be connected to the system bus 2108 by a hard disk drive interface 2124, a magnetic disk drive interface 2126 and an optical drive interface 2128, respectively. The interface 2124 for external drive implementations includes at least one or both of Universal Serial Bus (USB) and IEEE 1394 interface technologies. Other external drive connection technologies are within contemplation of the disclosed subject matter.

The drives and their associated computer-readable media provide nonvolatile storage of data, data structures, computer-executable instructions, and so forth. For the computer 2100 the drives and media accommodate the storage of any data in a suitable digital format. Although the description of computer-readable media above refers to a HDD, a removable magnetic diskette, and a removable optical media such as a CD or DVD, it should be appreciated by those skilled in the art that other types of media which are readable by a computer 2100, such as zip drives, magnetic cassettes, flash memory cards, cartridges, and the like, can also be used in the exemplary operating environment, and further, that any such media can contain computer-executable instructions for performing the methods of the disclosed subject matter.

A number of program modules can be stored in the drives and RAM 2112, including an operating system 2130, one or more application programs 2132, other program modules 2134 and program data 2136. All or portions of the operating system, applications, modules, and/or data can also be cached in the RAM 2112. It is to be appreciated that the disclosed subject matter can be implemented with various commercially available operating systems or combinations of operating systems.

A user can enter commands and information into the computer 2100 through one or more wired/wireless input devices, e.g., a keyboard 2138 and a pointing device, such as a mouse 2140. Other input devices (not shown) can include a microphone, an IR remote control, a joystick, a game pad, a stylus pen, touch screen, or the like. These and other input devices are often connected to the processing unit 2104 through an input device interface 2142 that is coupled to the system bus 2108, but can be connected by other interfaces, such as a parallel port, an IEEE 1394 serial port, a game port, a USB port, an IR interface, etc.

A monitor 2144 or other type of display device is also connected to the system bus 2108 through an interface, such as a video adapter 2146. In addition to the monitor 2144, a computer 2100 typically includes other peripheral output devices (not shown), such as speakers, printers, etc.

The computer 2100 can operate in a networked environment using logical connections by wired and/or wireless communications to one or more remote computers, such as a remote computer(s) 2148. The remote computer(s) 2148 can be a workstation, a server computer, a router, a personal computer, portable computer, microprocessor-based entertainment device, a peer device or other common network node, and typically includes many or all of the elements described relative to the computer, although, for purposes of brevity, only a memory/storage device 2150 is illustrated. The logical connections depicted include wired/wireless connectivity to a local area network (LAN) 2152 and/or larger networks, e.g., a wide area network (WAN) 2154. Such LAN and WAN networking environments are commonplace in offices and companies, and facilitate enterprise-wide computer networks, such as intranets, all of which can connect to a global communications network, e.g., the Internet.

When used in a LAN networking environment, the computer 2100 is connected to the local network 2152 through a wired and/or wireless communication network interface or adapter 2156. The adapter 2156 can facilitate wired or wireless communication to the LAN 2152, which can also include a wireless access point disposed thereon for communicating with the wireless adapter 2156.

When used in a WAN networking environment, the computer 2100 can include a modem 2158, or is connected to a communications server on the WAN 2154, or has other means for establishing communications over the WAN 2154, such as by way of the Internet. The modem 2158, which can be internal or external and a wired or wireless device, is connected to the system bus 2108 through the input device interface 2142. In a networked environment, program modules depicted relative to the computer, or portions thereof, can be stored in the remote memory/storage device 2150. It will be appreciated that the network connections shown are exemplary and other means of establishing a communications link between the computers can be used.

The computer is operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This includes at least Wi-Fi and Bluetooth™ wireless technologies. Thus, the communication can be a predefined structure as with a conventional network or simply an ad hoc communication between at least two devices.

Wi-Fi, or Wireless Fidelity, allows connection to the Internet from a couch at home, in a hotel room, or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE 802.11 (a, b, g, etc.) to provide secure, reliable, fast wireless connectivity. A Wi-Fi network can be used to connect computers to each other, to the Internet, and to wired networks (which use IEEE 802.3 or Ethernet). Wi-Fi networks operate in the unlicensed 2.4 and 5 GHz radio bands, at an 11 Mbps (802.11a) or 54 Mbps (802.11b) data rate, for example, or with products that contain both bands (dual band), so the networks can provide real-world performance similar to the basic 10BaseT wired Ethernet networks used in many offices.

Reference throughout this specification to "one embodiment," or "an embodiment," means that a particular feature, structure, or characteristic described in connection with the embodiment is included in at least one embodiment. Thus, the appearances of the phrase "in one embodiment," "in one aspect," or "in an embodiment," in various places throughout this specification are not necessarily all referring to the same embodiment. Furthermore, the particular features, structures, or characteristics can be combined in any suitable manner in one or more embodiments.

As used in this disclosure, in some embodiments, the terms "component," "system," "interface," and the like can refer to, or comprise, a computer-related entity or an entity related to an operational apparatus with one or more specific functionalities, wherein the entity can be either hardware, a combination of hardware and software, software, or software in execution, and/or firmware. As an example, a component can be, but is not limited to being, a process running on a processor, a processor, an object, an executable, a thread of execution, computer-executable instructions, a program, and/or a computer. By way of illustration and not limitation, both an application running on a server and the server can be a component.

One or more components can reside within a process and/or thread of execution and a component can be localized on one computer and/or distributed between two or more computers. In addition, these components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software application or firmware application executed by one or more processors, wherein the processor can be internal or external to the apparatus and can execute at least a part of the software or firmware application. As yet another example, a component can be an apparatus that provides specific functionality through electronic components without mechanical parts, the electronic components can comprise a processor therein to execute software or firmware that confer(s) at least in part the functionality of the electronic components. In an aspect, a component can emulate an electronic component via a virtual machine, e.g., within a cloud computing system. While various components have been illustrated as separate components, it will be appreciated that multiple components can be implemented as a single component, or a single component can be implemented as multiple components, without departing from example embodiments.

In addition, the various embodiments can be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, machine-readable device, computer-readable carrier, computer-readable media, machine-readable media, computer-readable (or machine-readable) storage/communication media. For example, computer-readable media can comprise, but are not limited to, a magnetic storage device, e.g., hard disk; floppy disk; magnetic strip(s); an optical disk (e.g., compact disk (CD), a digital video disc (DVD), a Blu-ray Disc™ (BD)); a smart card; a flash memory device (e.g., card, stick, key drive); and/or a virtual device that emulates a storage device and/or any of the above computer-readable media. Of course, those skilled in the art will recognize many modifications can be made to this configuration without departing from the scope or spirit of the various embodiments The words "example" and "exemplary" are used herein to mean serving as an instance or illustration. Any embodiment or design described herein as "example" or "exemplary" is not necessarily to be construed as preferred or advantageous over other embodiments or designs. Rather, use of the word example or exemplary is intended to present concepts in a concrete fashion. As used in this application, the term "or" is intended to mean an inclusive "or" rather than an exclusive "or." That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the subject matter has been described herein in connection with various embodiments and corresponding figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A method, comprising:
    forming an electrode; and
    modifying a surface of the electrode to reduce an amount of roughness of the surface of the electrode and alter a shape of the surface, wherein the amount of roughness is based at least in part on a number or a size of protrusions on the surface of the electrode, and wherein the altering of the shape of the surface of the electrode comprises altering the shape of the surface of the electrode from a flat or substantially flat shape to a rounded shape, comprising rounding an edge portion of the surface, on at least a first side of the surface and a second side of the surface that is perpendicular to the first side of the surface.

2. The method of claim 1, wherein the altering of the shape of the surface from the flat or substantially flat shape to the rounded shape comprises polishing or etching the surface to remove a portion of a material of the surface of the electrode to round the surface into a domed shape that has a center portion of the surface that is higher in height than edge portions of the surface that are lower in height relative to the center portion, wherein the surface spans from the higher center portion of the surface in the rounded shape to the edge portions of the surface that are lower in height, and wherein the edge portions comprise the edge portion.

3. The method of claim 1, wherein the modifying the surface of the electrode further comprises modifying the surface of the electrode to form at least one of striations or a defined pattern in or on the surface of the electrode.

4. The method of claim 1, wherein the electrode is usable in a sensor, wherein the modifying of the surface of the electrode facilitates enhancing an interfacing between the surface of the electrode and a conductive layer of the sensor that is configurable to be in contact with or proximity to the surface of the electrode, and wherein the sensor senses at least one of an amount of pressure impacting the sensor, an amount of force being applied to the sensor, or a contact with the sensor.

5. The method of claim 1, further comprising:
analyzing the amount of the roughness of the surface of the electrode or the alteration of the shape of the surface;
based at least in part on a result of the analyzing, determining whether the amount of the roughness of the surface or the alteration of the shape of the surface satisfies defined surface processing criteria that indicates a defined suitable amount of reduction of the roughness of the surface or a defined suitable alteration of the shape of the surface; and
at least one of:
  in response to determining that the amount of the roughness of the surface or the alteration of the shape of the surface satisfies the defined surface processing criteria, discontinuing the modifying of the surface of the electrode, or
  in response to determining that the amount of the roughness of the surface or the alteration of the shape of the surface does not satisfy the defined surface processing criteria, continuing performing the modifying of the surface of the electrode until the defined surface processing criteria is determined to be satisfied.

6. The method of claim 1, further comprising:
applying an abrasive material to the surface of the electrode or a chemical solution to the surface of the electrode to facilitate the modifying of the surface of the electrode, wherein a chemical process is employed to facilitate the applying of the chemical solution to the surface.

7. The method of claim 6, wherein the abrasive material is part of a group of abrasive materials comprising a sandpaper, an abrasive paste, a diamond paste, and an abrasive polishing cloth.

8. The method of claim 6, wherein the chemical process comprises at least one of a chemical etching process or a chemical polishing process.

9. The method of claim 6, further comprising:
controlling the modifying of the surface of the electrode based at least in part on at least one of an amount of pressure applied to the surface by the abrasive material, a type of the abrasive material applied to the surface, an amount of time the abrasive material is applied to the surface, or a region on the surface to which the abrasive material is applied.

10. The method of claim 6, wherein a sandpaper comprises an abrasive side that contains the abrasive material comprises and a non-abrasive side that is on an opposite side of the abrasive side, and wherein the method further comprises:
applying at least one of a polymer material or a foam material to the non-abrasive side of the sandpaper to facilitate controlling at least one of an amount of pressure of the abrasive material on the surface, a distribution of the pressure of the abrasive material on the surface, or a molding of the abrasive material in relation to the surface, during application of the abrasive material to the surface of the electrode, wherein the at least one of the polymer material or the foam material is at least one of flexible or compressible.

11. The method of claim 6, further comprising:
controlling the modifying of the surface of the electrode based at least in part on at least one of a type of the chemical solution or an amount of time the chemical solution is applied to the surface.

12. The method of claim 1, further comprising:
during the modifying of the surface of the electrode, retaining a circuit board, comprising a set of electrodes including the electrode, in a flat and stationary position on a flat surface.

13. The method of claim 12, further comprising:
applying a vacuum pressure to the circuit board to facilitate the retaining of the circuit board in the flat and stationary position on the flat surface.

14. The method of claim 12, further comprising:
applying a temporary adhesive to at least one of the flat surface or a bottom surface of the circuit board to facilitate the retaining of the circuit board in the flat and stationary position on the flat surface, wherein the electrode is formed on a top surface of the circuit board.

15. A device, comprising:
a sensor component comprising:
  an electrode component formed of a conductive material and comprising a surface; and
  a conductor component configured to interface with the surface of the electrode component to facilitate sensing of a condition by the sensor component, wherein the surface of the electrode component is modified to reduce an amount of roughness of the surface of the electrode component and change a shape of the surface, wherein the change to the shape of the surface of the electrode component comprises a rounding of the surface, including a rounding of an edge portion of the surface, on at least a first side of the surface and a second side of the surface that is adjacent to the first side of the surface, wherein the amount of roughness is based at least in part on a number or a size of protrusions on the surface of the electrode component, and wherein the modification of the surface of the electrode component enhances the interfacing between the surface of the electrode component and the conductor component.

16. The device of claim 15, wherein the rounding of the surface, including the rounding of the edge portion of the surface, comprises the surface of the electrode component being rounded in a form of a domed shape that has a center portion of the surface that is higher in height than edge portions of the surface that are lower in height relative to the center portion, wherein the surface spans from the higher height of the center portion of the surface in a rounded manner to the edge portions of the surface that are lower in height, and wherein the edge portions comprise the edge portion.

17. The device of claim 15, wherein the sensor component comprises a capacitive sensor or a piezoresistive sensor.

18. The device of claim 15, wherein the sensor component comprises an interpolating sensor or a non-interpolating sensor.

19. The device of claim 15, wherein the sensor component is configured to sense the condition, wherein the condition relates to a force applied to the sensor component, a pressure applied to the sensor component, or a contact with the sensor component.

20. The device of claim 15, wherein the modification of the surface of the electrode component reduces a cost of manufacturing of the sensor component and facilitates enhancement of at least one of a sensitivity of the sensor component, an accuracy of sensing by the sensor component, or a reliability of the sensor component.

21. The device of claim 15, wherein the device comprises a set of sensor components comprising the sensor component, wherein the set of sensor components are formed on a circuit board, and wherein other sensor components of the set of sensor components comprise other electrode components that are processed to modify surfaces of the other electrode components to at least one of reduce respective amounts of roughness of the surfaces of the other electrode components or change respective shapes of the surfaces.

22. A system, comprising:
a surface processor component configured to modify a surface of an electrode to reduce an amount of roughness of the surface of the electrode and change a shape of the surface, wherein the amount of roughness is based at least in part on a number or a size of protrusions on the surface of the electrode, and wherein the changing of the shape of the surface comprises changing the shape of the surface of the electrode from a flat or substantially flat shape to a rounded shape, comprising rounding an edge of the surface, on at least a first side of the surface and a second side of the surface that is perpendicular to the first side of the surface; and
an operation management component configured to control the modification of the surface of the electrode, in accordance with a defined surface processing criterion.

23. The system of claim 22, further comprising:
an abrasive component configured to apply an abrasive material to the surface of the electrode to facilitate the modification of the surface of the electrode; or
a chemical processor component configured to apply a chemical solution to the surface of the electrode to facilitate the modification of the surface of the electrode.

24. The system of claim 22, wherein at least one of:
the abrasive material is part of a group of abrasive materials comprising a sandpaper, an abrasive paste, a diamond paste, and an abrasive polishing cloth; or
the chemical solution is applied to the surface of the electrode as part of performance of a chemical etching or a chemical polishing of the surface.

25. The system of claim 22, wherein the electrode is part of a set of electrodes formed on a top surface of a circuit board, and wherein the system further comprises:
a vacuum chuck component configured to apply a vacuum force to the circuit board to retain the circuit board in a flat and a stationary position on a first flat surface of or associated with the vacuum chuck component, to facilitate modification of surfaces of the set of electrodes, comprising the surface of the electrode; or
an adhesive component configured to apply a temporary adhesive material to a bottom surface of the circuit board to retain the circuit board in the flat and the stationary position on a second flat surface, to facilitate the modification of the surfaces of the set of electrodes.

* * * * *